(12) United States Patent
Kubota et al.

(10) Patent No.: US 11,520,021 B2
(45) Date of Patent: Dec. 6, 2022

(54) LIGHT RECEIVING DEVICE AND RANGE FINDING DEVICE INCLUDING A SWITCH CIRCUIT WHICH RE-ARRANGES THE ORDER OF SIGNALS OUTPUT FROM A LIGHT RECEIVER

(71) Applicants: Kabushiki Kaisha Toshiba, Minato-ku (JP); Toshiba Electronic Devices & Storage Corporation, Minato-ku (JP)

(72) Inventors: Hiroshi Kubota, Fussa (JP); Nobu Matsumoto, Ebina (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 503 days.

(21) Appl. No.: 16/561,446

(22) Filed: Sep. 5, 2019

(65) Prior Publication Data

US 2020/0300985 A1    Sep. 24, 2020

(30) Foreign Application Priority Data

Mar. 19, 2019 (JP) .............................. JP2019-050991

(51) Int. Cl.
*H01L 27/144* (2006.01)
*G01S 7/4863* (2020.01)
(Continued)

(52) U.S. Cl.
CPC ............ *G01S 7/4863* (2013.01); *G01S 17/10* (2013.01); *H01L 27/1446* (2013.01); *H01L 31/02027* (2013.01); *H01L 31/107* (2013.01)

(58) Field of Classification Search
CPC ........ G01S 17/42; G01S 17/10; G01S 17/894; G01S 17/89; G01S 17/88; G01S 7/4868;
(Continued)

(56) References Cited

U.S. PATENT DOCUMENTS 9,952,323 B2 * 4/2018 Deane ..................... G01S 17/10
10,000,000 B2   6/2018 Marron
(Continued)

FOREIGN PATENT DOCUMENTS

JP    2012-202776 A    10/2012
JP    2017-520134      7/2017
(Continued)

OTHER PUBLICATIONS

Ximenes, A, et al., "A 256×256 45/65nm 3D-Stacked SPAD-Based Direct TOF Image Sensor for LiDAR Applications with Optical Polar Modulation for up to 18.6 dB Interference Suppression", 2018 IEEE International Solid-State Circuits Conference—(ISSCC), 3 pages.

*Primary Examiner* — Que Tan Le
(74) *Attorney, Agent, or Firm* — Oblon, McClelland, Maier & Neustadt, L.L.P.

(57) ABSTRACT

A light receiving device includes a light receiver including pixels and a light receiving area. The pixels are arranged in an array in a first direction and in a second direction intersecting with the first direction and each of the pixels has one light receiving element or more. The light receiving area has continuous pixels out of the pixels, outputs signals based on intensities of light received in the continuous pixels, and is changed in position in the light receiver according to a signal indicating a position in the first direction and a position in the second direction.

18 Claims, 11 Drawing Sheets

(51) Int. Cl.
*G01S 17/10* (2020.01)
*H01L 31/02* (2006.01)
*H01L 31/107* (2006.01)

(58) Field of Classification Search
CPC .......... G01S 17/04; G01S 17/06; G01S 7/486;
G01S 7/49; H01L 27/1461; H01L
27/14603; H01L 27/14605; H01L 27/146;
H01L 31/107; H01L 31/02024; H01L
27/144
USPC .......................................... 250/208.1, 214 R
See application file for complete search history.

(56) References Cited

U.S. PATENT DOCUMENTS

| | | | |
|---|---|---|---|
| 10,101,203 B2 | 10/2018 | Birk et al. | |
| 10,848,693 B2 * | 11/2020 | Agranov | H04N 5/3572 |
| 2015/0285625 A1 | 10/2015 | Deane | |
| 2017/0150078 A1 | 5/2017 | Ukai et al. | |
| 2017/0212223 A1 | 7/2017 | Slobodyanyuk et al. | |
| 2017/0363740 A1 | 12/2017 | Kubota et al. | |
| 2018/0081040 A1 | 3/2018 | Kubota et al. | |
| 2018/0195900 A1 | 7/2018 | Delic | |
| 2018/0270405 A1 | 9/2018 | Ota | |

FOREIGN PATENT DOCUMENTS

| | | |
|---|---|---|
| JP | 2017-178217 A | 10/2017 |
| JP | 2017-178246 A | 10/2017 |
| JP | 2018-044923 A | 3/2018 |
| JP | 2018-059898 A | 4/2018 |
| JP | 2018-510362 A | 4/2018 |
| JP | 6333189 B2 | 5/2018 |
| JP | 2018-157387 A | 10/2018 |
| JP | 2018-530176 A | 10/2018 |
| JP | 6420941 B2 | 11/2018 |
| JP | 2018-536144 A | 12/2018 |
| JP | 2019-32305 | 2/2019 |
| JP | 2019-046282 A | 3/2019 |
| JP | 2019-046820 A | 3/2019 |
| JP | 2019-047373 A | 3/2019 |
| JP | 2019-055105 A | 4/2019 |
| WO | WO 2018/031165 A1 | 2/2018 |

* cited by examiner

LIGHT RECEIVING DEVICE AND RANGE FINDING DEVICE INCLUDING A SWITCH CIRCUIT WHICH RE-ARRANGES THE ORDER OF SIGNALS OUTPUT FROM A LIGHT RECEIVER

CROSS REFERENCE TO RELATED APPLICATIONS

This application is based upon and claims the benefit of priority from the prior Japanese Patent Application No. 2019-050991, filed on Mar. 19, 2019, the entire contents of which are incorporated herein by reference.

FIELD

The embodiments of the present invention relates to a light receiving device and range finding device.

BACKGROUND

Light detection and ranging (LIDAR) irradiates a measurement target with laser light, senses the intensities of the light reflected from the measurement target with a sensor, and converts the intensities into time-series digital signals based on outputs of the sensor. It measures the distance to the measurement target based on a time difference between the light emission by the laser and a peak or the like of values of the converted digital signals.

In the LIDAR technology, in particular, in in-vehicle LIDAR, studies have been conducted on a two-dimensional array sensor that uses Silicon Photo Multiplier (SiPM). However, because of the requirements for the sufficient reduction of noise caused by ambient light and the accurate synchronization of the sensor which receives the light, it is difficult for the conventional method to achieve high-performance LIDAR using SiPM.

DETAILED DESCRIPTION

Figure 1:
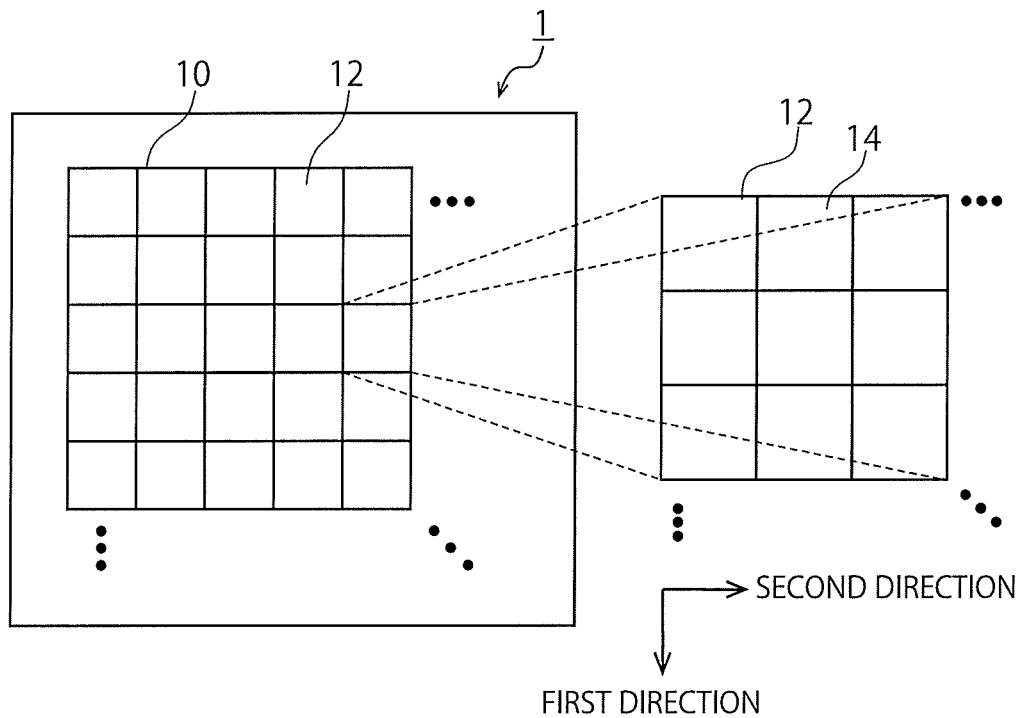
FIG. 1 schematically illustrates a light receiver of a light receiving device having a SiPM array.

According to one embodiment, a light receiving device includes a light receiver including pixels and a light receiving area. The pixels are arranged in an array in a first direction and in a second direction intersecting with the first direction and each of the pixels has one light receiving element or more. The light receiving area has continuous pixels out of the pixels, outputs signals based on intensities of light received in the continuous pixels, and is changed in position in the light receiver according to a signal indicating a position in the first direction and a position in the second direction.

Embodiments will be hereinafter described with reference to the drawings. The drawings are presented only as examples and are not intended to limit this embodiment. Further, positions, dimension ratios, and so on in the drawings are also presented only as examples for the simplification of the description and are not accurate positions, accurate dimension ratios, and so on unless specifically mentioned. In the description, a position indicated by a smaller index will be referred to as upstream, and a signal transmission direction is from a position indicated by a smaller index to a position indicated by a larger index. This is only an example, and in actual implementation, the signal transmission direction may be a reverse direction, provided that it is a direction in which a signal is uniquely transmitted.

First Embodiment

FIG. 1 is a schematic view illustrating a light receiver 10 of a light receiving device 1. The light receiving device 1 includes the light receiver 10 as a photo-sensor. The light receiver 10 includes channels 12. The 25 channels 12 are illustrated, but this is not restrictive, and the light receiver 10 may be composed of one channel, or may include a larger number of the channels than 25. That is, the number of the channels 12 included in the light receiver 10 is one or more.

The right view in FIG. 1 is an enlarged view of a channel 12 portion. The channel 12 includes one single photon avalanche diode (SPAD) 14 or more. The number of the SPADs 14 is not limited to the number in FIG. 1. The SPADs 14 each include, for example, a SPAD or normal avalanche photodiode (APD) as a light receiving element. The SPAD 14 senses light reception photon by photon using avalanche breakdown and converts it into an electric signal to detect the light. In this specification, the channel will be hereinafter referred to as a pixel. Ordinarily, SPAD is sometimes called pixel, but it should be noted that, in this specification, SPAD is not called pixel.

The light receiving device 1 is capable of detecting a light receiving position based on at which positions the pixels 12, out of the pixels 12 arranged in an array, that have received the light disposed, and is capable of detecting the intensity of the received light. In the description below, the illustrated first direction and second direction intersecting with the first direction will be used for convenience' sake. In the description, the up-down direction is a direction along the first direction, and the left-right direction is a direction along the second direction. These directions are relative directions which are defined when the pixels 12 are arranged in an array, and may be interchanged. Further, considering the properties of the light receiving device 1, the first direction and the second direction desirably intersect at a right angle, though not in a strict sense, and may intersect at a predetermined angle which is not strictly a right angle, depending on the shape or the like of the SPAD. Further, the pixels 12 and the SPADs 14 are each illustrated as a square, but their shape is not limited to this and may be another shape, for example, a rectangle.

Figure 2:
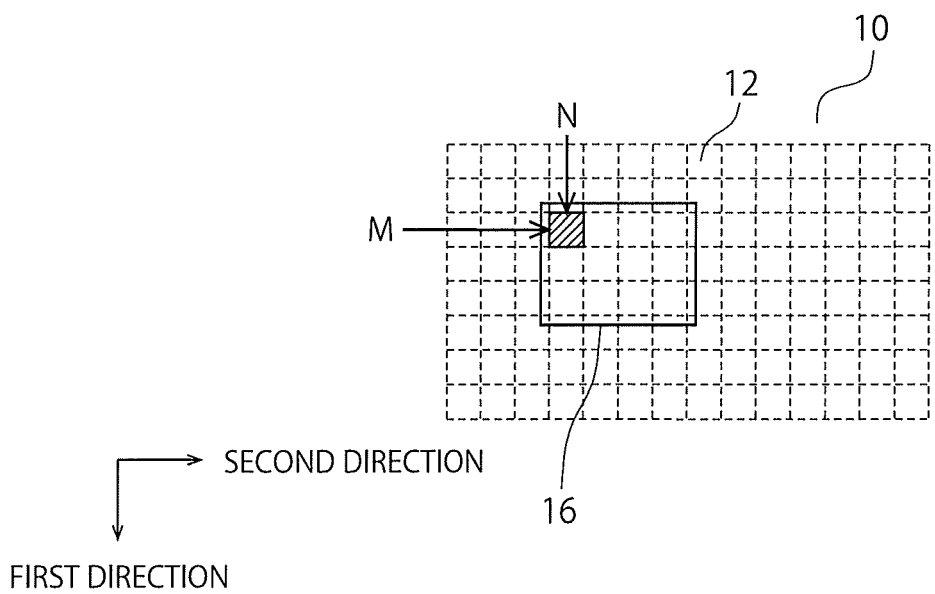
FIG. 2 illustrates a light receiving area according to one embodiment.

FIG. 2 is a view illustrating an example of a light receiving area 16 in the light receiver 10 and the arrangement of the pixels 12 according to this embodiment. Here, the light receiving area is only a name, and this area does not necessarily have to entirely receive light. Boundaries of the pixels 12 are depicted by dotted lines, and boundaries of the light receiving area 16 are depicted by solid lines. In this embodiment, the position is not detected from light sensed in each of the pixels 12 but it is determined whether or not light is received, based on light sensed in a certain range within the light receiving area. For example, the light receiving area 16 is a rectangular area having 3×4 pixels 12.

In the light receiving area 16, the pixel count in the first direction will be referred to as a first predetermined number, and the pixel count in the second direction will be referred as a second predetermined number. Thus, the light receiving area 16 is an area having the continuous pixels 12 arranged in a predetermined range at a designated light receiving position. For example, the first predetermined number is 3 and the second predetermined number is 4.

For example, the first-direction and second-direction coordinates of the left upper pixel 12 depicted by the oblique lines are used to designate the position of the light receiving area 16. When the left upper pixel 12 is a pixel that is the M-th pixel in the first direction and the N-th pixel in the second direction, the position is indicated using the coordinates M, N. The way to designate the position is not limited to the use of the coordinates of the pixel 12, but the coordinates of a left lower pixel, a right upper pixel, a right lower pixel, or a center pixel may be used. Any other way may be used, provided that the position can be uniquely specified. For example, when the left upper position M, N is designated, light received in the pixels 12 in the rectangular area having the first predetermined number of the pixels in the first direction and the second predetermined number of the pixels in the second direction from the left upper pixel 12 is converted into signals and these signals are output. By designating this position, it is possible to detect whether or not the light is received at the position optionally designated in the light receiver 10.

The pixels 12 in the light receiving area 16 each output the intensity of the received light. Thus, the signals of the light received by the respective pixels 12 are not combined, but the signal is separately output from each of the pixels 12. If the light is not uniformly radiated to the whole light receiving area 16 and is radiated only to some of the pixels 12, separately outputting the signals from the respective pixels 12 enables the use of only the signals of the pixels 12 irradiated with the light. This makes it possible to eliminate noise from the pixels 12 not irradiated with the light, accordingly leading to an improved signal to noise ratio (SNR). Because the light irradiation in the light receiving area 16 is non-uniform and because this non-uniformity increases as a result of narrowing the focus of light, separately outputting the signals improves SNR. On the other hand, since a device which receives the outputs of the respective pixels 12 of the light receiving area 16 (for example, a processing circuitry side) is capable of combining the outputs, it is possible to handle the light receiving area 16 as if it is one pixel.

Figure 3:
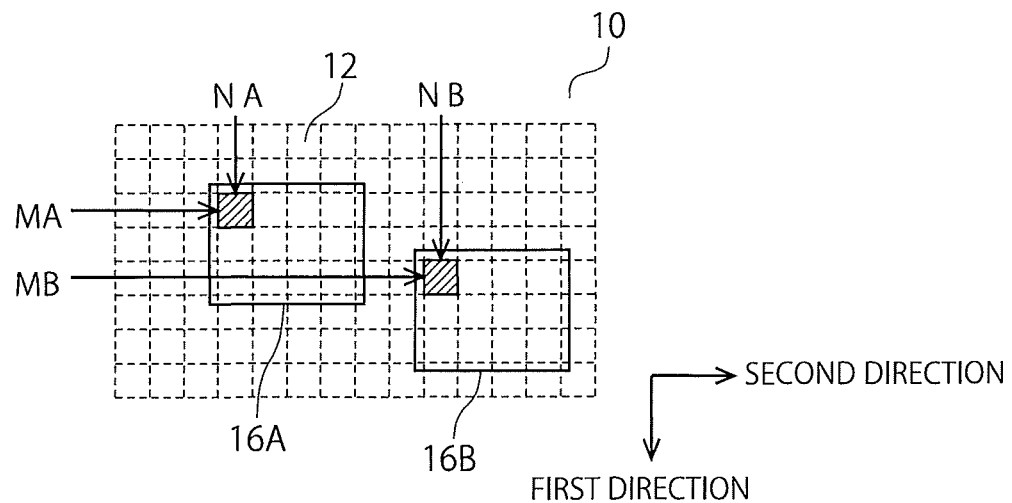
FIG. 3 illustrates light receiving areas according to one embodiment.

FIG. 3 is a view illustrating another form of the light receiving area. The number of light receiving areas is not necessarily one but there may be a plurality of light receiving areas 16A, 16B. In this case, the position of each of the light receiving areas 16A, 16B is determined by the coordinates. The position of the light receiving area 16A is determined by the coordinates MA, NA, and the position of the light receiving area 16B is determined by the coordinates MB, NB. When there are a plurality of light emitting devices such as lasers whose lights are to be received, providing the plurality of light receiving areas enables to detect the lights received from the respective light emitting devices by scanning these light receiving areas. Further, the light receiving areas 16A, 16B are illustrated as being discrete, but this is not restrictive, and they may share some of the pixels 12.

Figure 4:
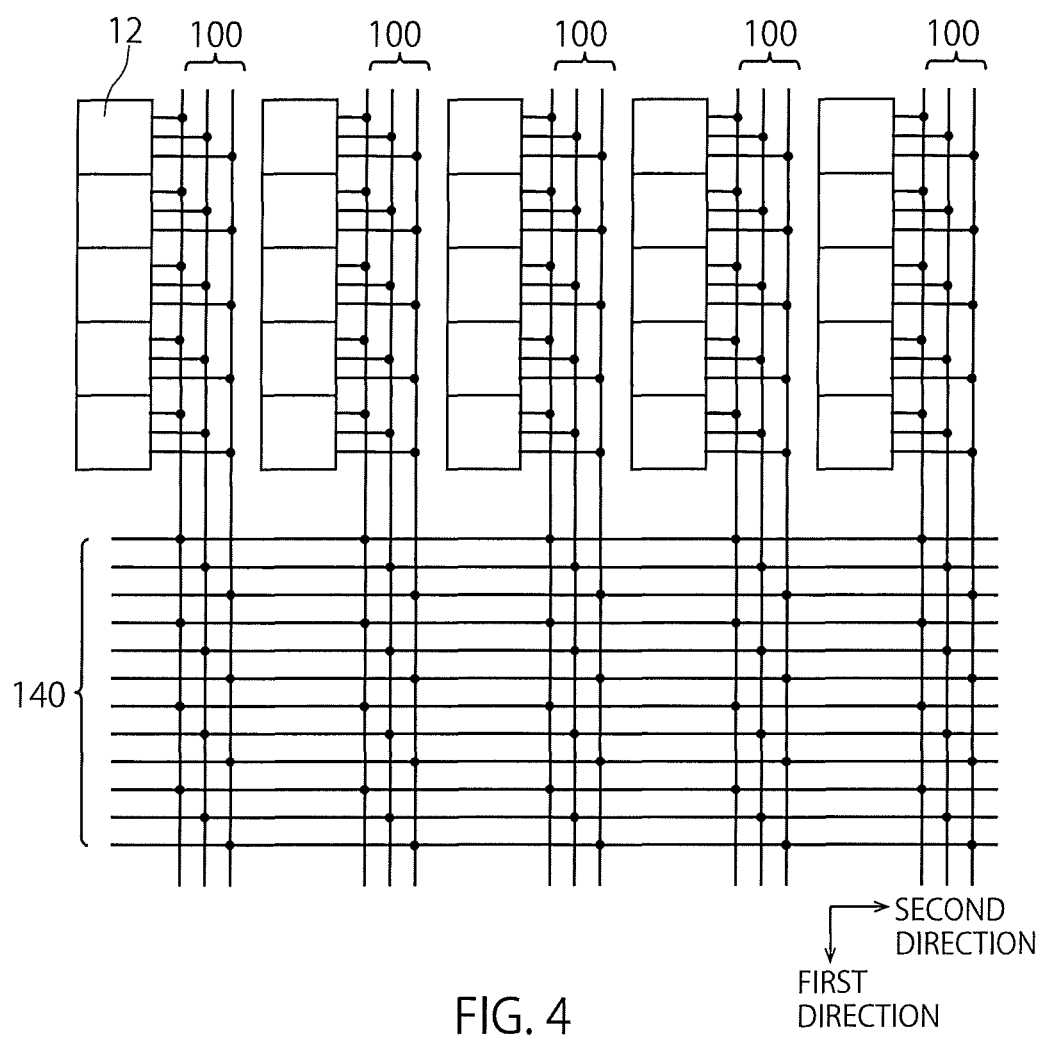
FIG. 4 illustrates the connection between pixels and signal lines according to one embodiment.

FIG. 4 is a diagram illustrating a connection relation regarding the pixels 12 for implementing the light receiving area 16. The first predetermined number of first signal lines 100, which are output paths, connect with each of the pixels 12. When the light receiving area 16 is a 3×4 area as illustrated in FIG. 2, the pixels 12 each connect with the three first signal lines 100 as illustrated in FIG. 4. The pixels 12 arranged along the first direction at the same second-direction position connect with the same first signal lines 100.

The first signal lines 100 each connect with second signal lines 140 extending along the second direction. For example, the number of the second signal lines 140 is equal to the pixel count in the light receiving area 16, that is, (the first predetermined number)×(the second predetermined number). In the above example, the number of the second signal lines 140 is 3×4=12.

At each of intersections of signal lines from the pixels 12 and the first signal lines 100 and at each of intersections of the first signal lines 100 and the second signal lines 140, a switch is provided. By these switches turning on to connect the signal lines, it is possible to obtain the signals from the pixels 12 through the first signal lines 100 and the second signal lines 140.

Selection lines each indicating the position are used for turning on the switches. First selection lines connect with the first switches provided at the intersections of the signal lines from the pixels 12 and the first signal lines 100, and second selection lines connect with the second switches provided at the intersections of the first signal lines 100 and the second signal lines 140. The first selection line and the second selection line respectively indicate the first-direction position and the second-direction position of the aforesaid light receiving area 16 to determine the light receiving area 16.

The switches each may include, for example, a metal-oxide-semiconductor field-effect transistor (MOSFET). In this case, a drive terminal of the switch is a gate, and a voltage higher than a threshold gate-source voltage is applied to the corresponding selection line when it is selected.

The signal lines, the switches, and the selection lines will be described in detail.

Figure 5:
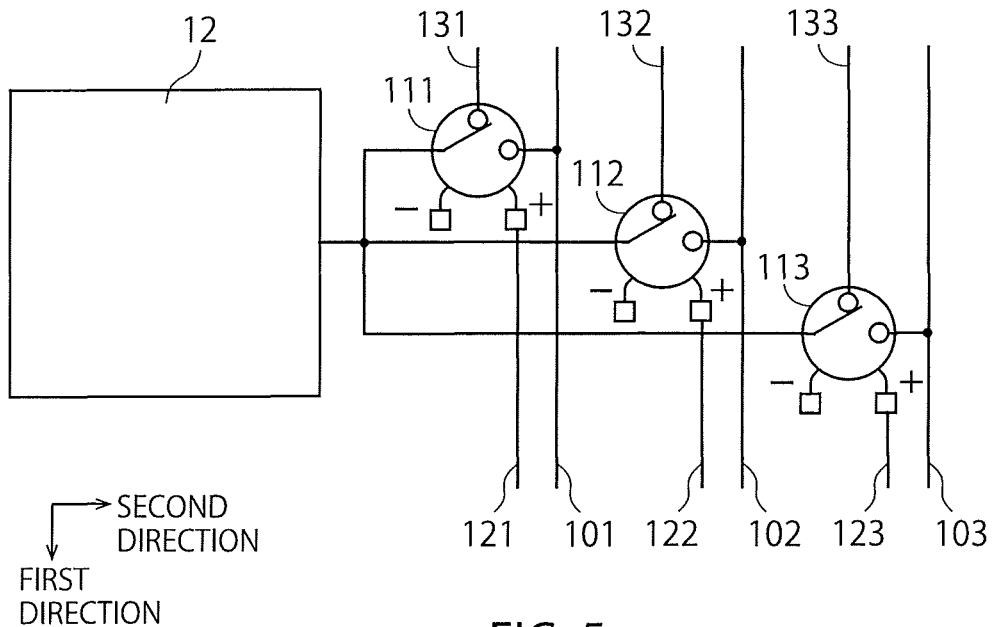
FIG. 5 illustrates the connection between a pixel and first signal lines according to one embodiment.

FIG. 5 is a diagram illustrating an example of the connection between the pixel 12 and the first signal lines 100. For the description, a diagram where the single pixel 12 connects with the three first signal lines 100 is used. For convenience' sake, the first signal lines 100 are denoted by reference numerals 101, 102, 103, the first switches 110 are denoted by reference numerals 111, 112, 113, and later-described first dummy lines 130 are denoted by reference numerals 131, 132, 133, and they each represent one of the plurality of elements. The pixel 12 is connected to the first signal lines 101, 102, 103 through the first switches 111, 112, 113.

The pixel 12 is connected to the first signal line 101 through the first switch 111. In an off state, the first switch 111 is not in connection with the first signal line 101. The first switch 111 connects with the first selection line 121 from which its drive terminal receives a selection signal. When receiving the signal for selecting the pixel 12 and the first signal line 101 from the first selection line 121, the first switch 111 turns on to connect the first signal line 101 and the pixel 12. The signal passed in the selection line is, for example, a High or Low signal and is a signal which determines a drive state of the switch.

When in the off state, that is, when not receiving the signal for selecting the first signal line 101 from the first selection line 121, the first switch 111 connects the pixel 12 to the first dummy line 131, for instance. The first dummy line 131 is a signal line not connecting with the first signal line 101 and connecting with a device or the like which processes an input signal so as to reduce its influence on the light receiving device 1. For example, the first dummy line 131 may be grounded to pass the signal from the pixel 12 to the contact plane. Further, the first dummy line 131 is not indispensable, and if the first dummy line 131 connecting with the first switch 111 is not present, the signal line from the pixel 12 may be in an open state when the first switch 111 is off.

Similarly, the pixel 12 is connected to either the first signal line 102 or the first dummy line 132 through the first switch 112 according to a signal from the first selection line 122, and is connected to either the first signal line 103 or the first dummy line 133 through the first switch 113 according to a signal from the first selection line 123. The pixel 12 becomes in connection with one of or none of the first signal lines 101, 102, 103.

The connection regarding the single pixel 12 is as illustrated in FIG. 5. Next, the connection regarding the pixels 12 arranged in the first direction will be described. The position of the light receiving area 16 is designated through the designation of the position of the pixel 12 as described above. Based on the designated pixel 12, the pixels 12 in the light receiving area 16 are each connected to one of the first signal lines. As an example, a case where the position M, N which is the position of the left upper pixel 12 in the light receiving area 16 illustrated in FIG. 2 is designated will be described. To designate the position of the light receiving area 16, the left upper pixel 12 in the light receiving area 16 is designated here, but even in other cases, the operation with the same configuration is possible.

Figure 6:
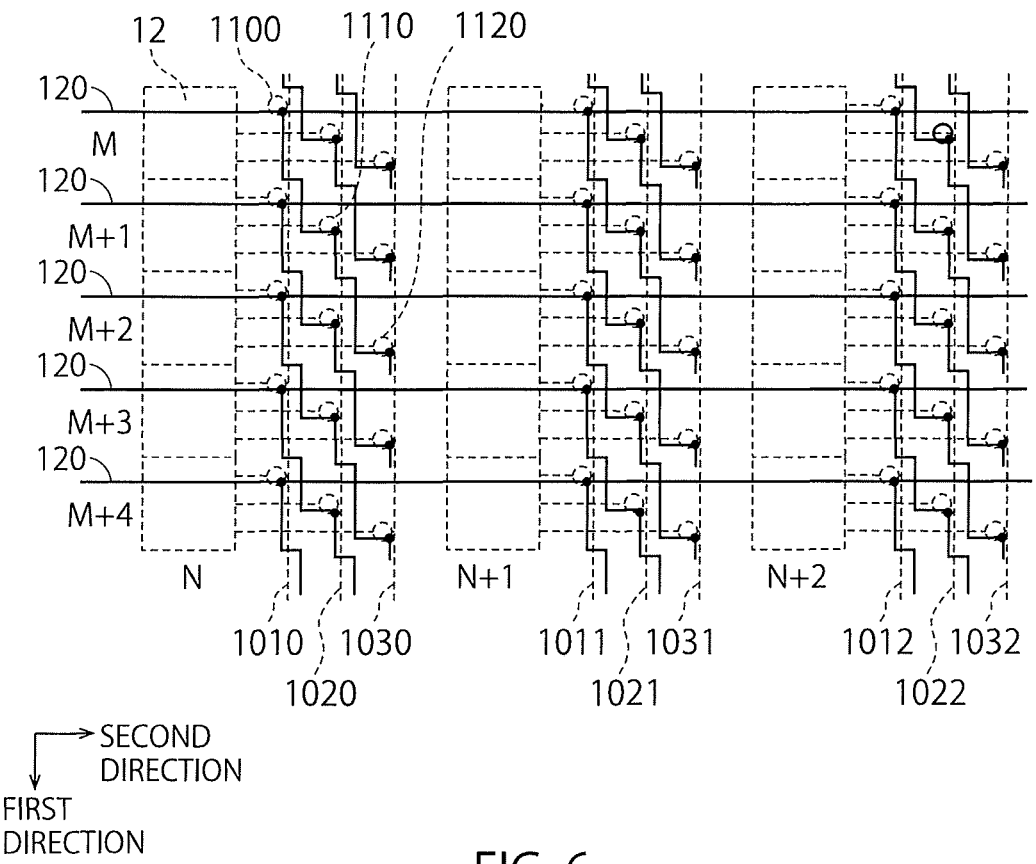
FIG. 6 illustrates the connection between the pixels and the first signal lines according to one embodiment.

FIG. 6 is a diagram illustrating the connection of some of the pixels 12 and the first signal lines 100. The first selection lines 120 are each common to the pixels 12 arranged along the second direction. The first selection lines 12 are depicted by solid lines, the first switches 110 and the pixels 12 are depicted by dotted lines, and the first dummy lines 130 are not illustrated. In the following, each four-digit reference numeral represents an element denoted by a reference numeral having the same upper two digits, for example, 11xx represents the first switch and 10xx represents the first signal line unless otherwise specified.

The first switches 110 each connect with one of the first selection lines 120. The first switches 110 are each switched on based on the selection signal input from the first selection line 120 connecting therewith. As a result of this switching, the signal from the pixel 12 is output selectively from one of the first signal lines 100 extending along the first direction.

For example, the first selection line 120 for selecting the first-direction position M connects with, for example, selection signal input terminals (drive terminals) of the leftmost first switch 1100 at the first-direction position M, the first switch 1110 which is the second one from the left at the first-direction position M+1, and the first switch 1120 which is the third one from the left at the first-direction position M+2. In this manner, the single first selection line 120 is arranged so as to be capable of changing the connection or not of the first predetermined number of the (for example, three) pixels 12 continuous in the first direction (for example, the pixels at the first-direction positions M, M+1, and M+2) out of the pixels 12 at the second-direction position N to the different first signal lines 100. The first signal lines 100 may be connected such that, after they are connected to the drive terminals of the three first switches 110, the signals appropriately flow, for example, they may be grounded through resistors.

The first selection line 120 corresponding to the first-direction position M connects with the first switches 110 which change the transmission or not of the outputs of the pixels 12 at the first-direction position M at the second-direction positions N, N+1, . . . . As a result of thus transmitting the selection signal in the single first selection line 120, the pixels 12 present at the designated first-direction position are connected to the first switches 110 so as to be selected.

As an example, a description will be given of a case where the light receiving area 16 is designated using the position of the left upper pixel 12, the pixel count in the first direction and the pixel count in the second direction in the light receiving area 16 is three and three or more respectively, and the light receiving area 16 whose left upper pixel 12 is at the position M, N is designated. That is, a case where the positions of the pixels 12 included in the light receiving area 16 are M~M+2, N~N+n(n≥2) will be described. In this case, in the first selection line 120 at the first-direction position M, the selection signal indicating the selection is input.

Figure 7:
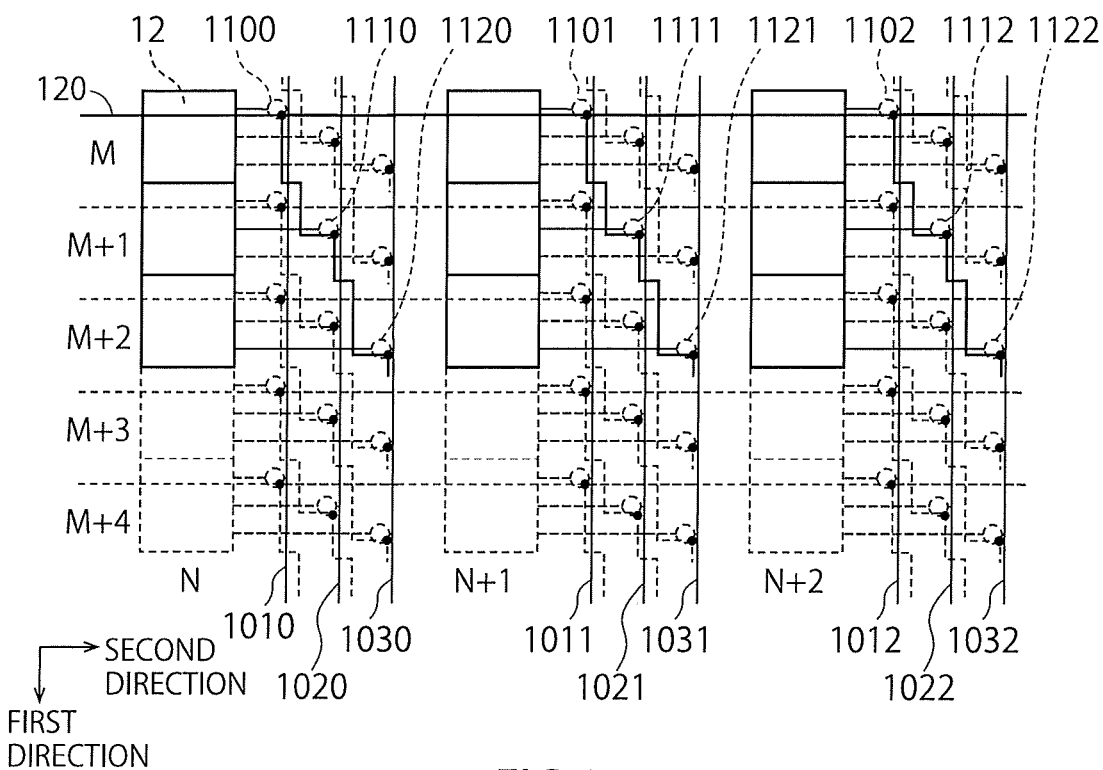
FIG. 7 illustrates the connection between the pixels and the first signal lines according to one embodiment.

FIG. 7 is a diagram illustrating a connection state of the pixels 12 and the first signal lines 100 in the above case. A case where the selection signal is passed in the first selection line 120 at the first-direction position M will be described. In FIG. 7, the pixels 12 depicted by the solid lines are pixels that are selected to be active, and the lines depicted by the solid lines are active conducting wires.

The pixel 12 at the position M, N is connected, through the first switch 1100, to the first signal line 1010 corresponding to the second-direction position N. This is because the first switch 1100 is driven by the selection signal input from the first selection line 120 to connect this pixel 12 to the first signal line 1010. Then, a signal converted from the light received by the pixel 12 at this position is output to the first signal line 1010.

The pixel 12 at the position M+1, N is connected, through the first switch 1110, to the first signal line 1020 corresponding to the second-direction position N. A signal converted from the light received by the pixel 12 at this position is output to the first signal line 1020. The pixel 12 at the position M+2, N is connected, through the first switch 1120, to the first signal line 1030 corresponding to the second-direction position N. A signal converted from the light received by the pixel 12 at this position is output to the first signal line 1030.

Similarly, the pixels 12 present at the second-direction positions N+1, N+2, . . . at the first-direction positions M, M+1, M+2 are respectively connected to the first signal lines 1011, 1021, 1031, 1012, 1022, 1032 corresponding to the respective second-direction positions through the first switches 1101, 1111, 1121, 1102, 1112, 1122. In this manner, the pixels 12 present at the first-direction positions M, M+1, M+2 are each connected uniquely to the first signal line 100, and when the light is received by these pixels 12, the signals are output through the respective first signal lines 100.

As described above, the first signal lines 100 are each connected to one of the pixels 12 based on the designated first-direction position, and the signal is output at the time when this pixel 12 receives the light. The second signal lines 140 connect with the first signal lines 100 extending along the first direction between the pixels 12 adjacent in the second direction and each designate the second-direction position. As illustrated in FIG. 4, the second signal lines 140 are provided along the second direction outside the arrangement area of the pixels 12.

It should be noted that the wiring in FIG. 7 is only an example, and this wiring is not restrictive. Any other wiring may be adopted, provided that the connection state of the pixels 12 and the corresponding first signal lines 100, first switches 110, and first selection lines 120 is the same. For example, the first selection lines 120 are arranged in a stepped manner in order to connect with the corresponding first switches 110, but this is not restrictive, and they may be arranged in a linear manner obliquely to the first direction and the second direction so as to connect with the drive terminals of their connection-destination first switches 110. Further, FIG. 7 illustrates the two-dimensional space, but this may be developed also in a three-dimensional direction. The same applies to the following drawings.

Figure 8:
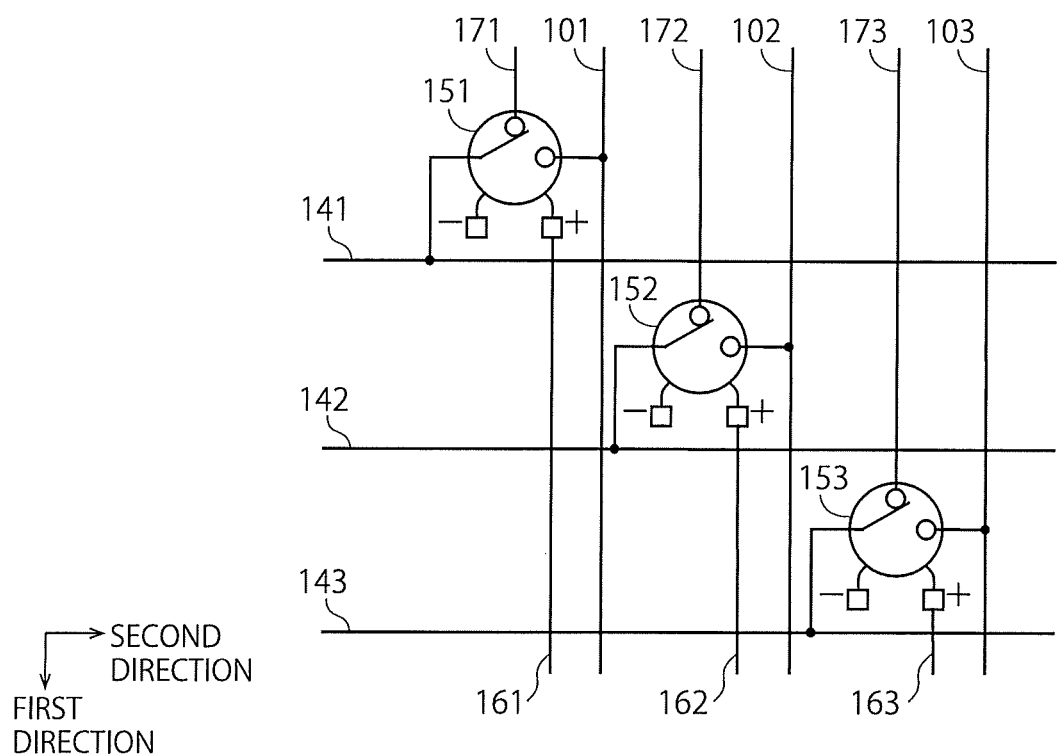
FIG. 8 illustrates the connection between the first signal lines and second signal lines according to one embodiment.

FIG. 8 is a diagram illustrating the connection between the first signal lines 100 and the second signal lines 140. As in FIG. 5, for convenience' sake, the first signal lines 100 are denoted by reference numerals 101, 102, 103, the second signal lines 140 are denoted by reference numerals 141, 142, 143, the second switches 150 are denoted by reference numerals 151, 152 153, the second selection lines 160 are denoted by reference numerals 161, 162, 163, and second dummy lines 170 are denoted by reference numerals 171, 172, 173, and they each represent one of the plurality of elements.

The first signal line 101 is connected to the second signal line 141 through the second switch 151. The second selection line 161 connects with the drive terminal of the second switch 151. Upon receiving the selection signal from the second selection line 161, the second switch 151 changes from an off state to an on state to connect the first signal line 101 and the second signal line 141. When a signal flows in the first signal line 101 in this state, the signal is also output to the second signal line 141. Similarly, the second switches 152, 153 respectively change the connection or not between the first signal line 102 and the second signal line 142 and between the first signal line 103 and the second signal line 143. The second selection lines 162, 163 connect with the drive terminals of the second switches 152, 153 respectively.

The second selection lines 161, 162, 163 connecting with the second switches 151, 152, 153 corresponding to the second signal lines 141, 142, 143 respectively connecting with the first signal lines 100 belonging to the same second-direction position may be electrically connected or may be the same second selection line 160.

Figure 9:
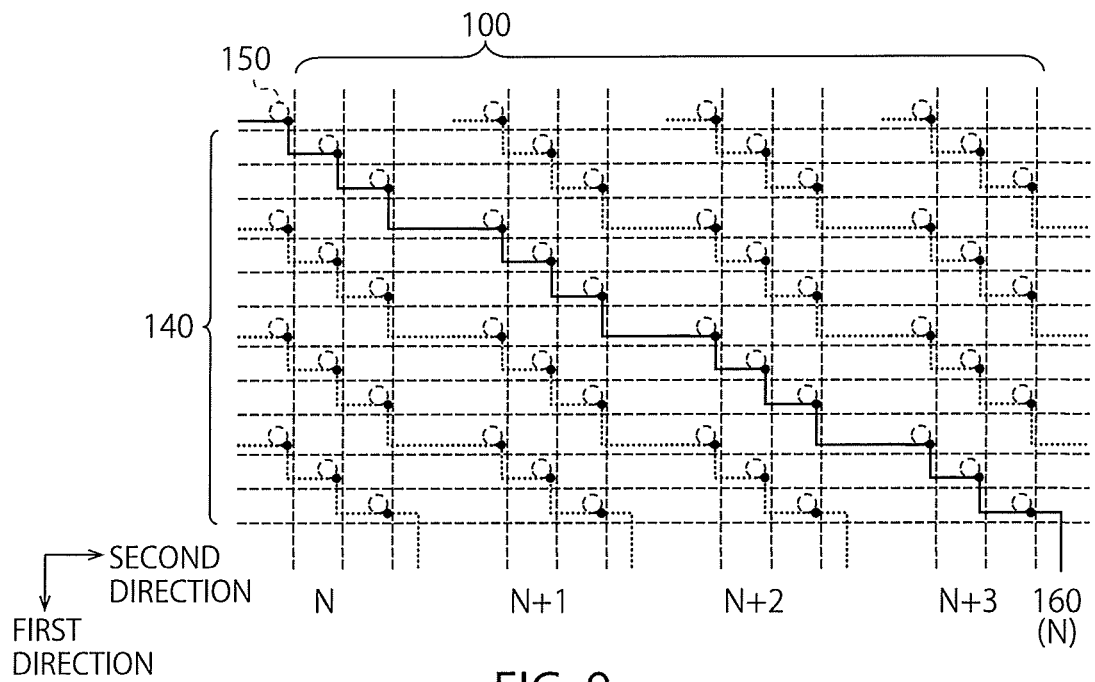
FIG. 9 illustrates the connection between the first signal lines and the second signal lines according to one embodiment.

FIG. 9 is a diagram illustrating the connection of the first signal lines 100 and the second signal lines 140, and it particularly illustrates the connection of the second switches 150 and the second selection lines 160 in detail. The first signal lines 100 and the second signal lines 140 are arranged such that, for example, the second signal lines 140 are connected to the first signal lines 100 in one-to-one correspondence according to the selection signal from the single second selection line 160.

As an example, a case where the signal line depicted by the solid line is the second selection line indicating the second-direction position N will be described. The second selection line 160 connects with the drive terminals of the second switches 150 to which the first signal lines 100 corresponding to the second-direction positions N, N+1, N+2, N+3 and the second signal lines 140 are uniquely connected. Such connection results in that the signals output from the pixels 12 arranged in the first direction and the second direction are output to the second signal lines 140.

Figure 10:
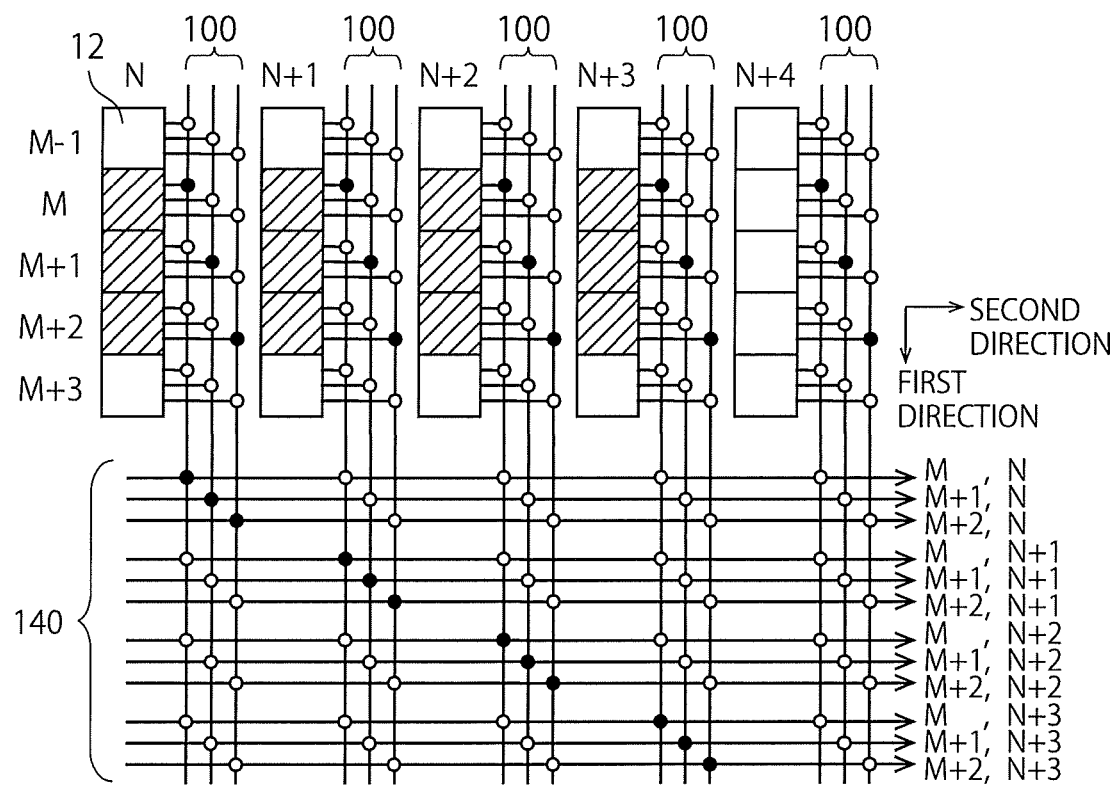
FIG. 10 illustrates a relation between the pixels and outputs of the light receiving device according to one embodiment.

FIG. 10 illustrates an example of the positions of the pixels 12 corresponding to the signals output from the second signal lines 140 when the pixel 12 at the position M, N is designated through the first selection line 120 and the second selection line 160. That is, the pixel position M is selected in the first selection line 120 in FIG. 7, and the pixel position N is selected in the second selection line 160 in FIG. 9. In FIG. 10, the illustration of the selection lines and the dummy lines is omitted.

In the case where the first predetermined number is 3 and the second predetermined number is 4 and the pixel 12 at the position M, N is designated as the left upper pixel of the light receiving area 16, the signals from the pixels 12 depicted by the oblique lines are output. In this case, the signals from the pixels 12 located at the first-direction positions M, M+1, M+2 and the second-direction positions N, N+1, N+2, N+3 are output as signals of the light receiving area 16.

The first switches 110 and the second switches 150 are represented by the white circles or the black circles. The switches represented by the white circles are switches that are off, and for example, are switches connected to the dummy lines. The switches represented by the black circles are switches that are on because the selection signals as drive signals are applied thereto through the selection lines from a driver. That is, the switches represented by the black circles each connect the output from the pixel 12 and the first signal line 100, or connect the first signal line 100 and the second signal line 140.

The pixel 12 at the position M, N is connected to, for example, the leftmost first signal line 100 out of the first signal lines 100 to which this pixel 12 can be connected through the first switches 110. This first signal line 100 is connected to the uppermost second signal line 140 through the left upper second switch 150 out of the illustrated second switches 150. Then, this first signal line 100 is connected, through the uppermost second signal line 140, to a circuit (or device) which receives information about received light, and the information about the light received by the pixel 12 is output through this second signal line 140.

The pixel 12 at the position M+1, N is connected to the first signal line 100 that is the second one from the left, through the first switch 110. This first signal line 100 is connected to the second signal line 140 that is the second one from the top, through the second switch 150. The pixel 12 at the position M, N+1 is connected, through the first switch 110, to the leftmost signal line out of the corresponding first signal lines 100. This first signal line 100 is connected to the second signal line 140 that is the fourth one from the top, through the second switch 150.

FIG. 10 shows, in its right lower part, the positions of the pixels 12 whose signals are output from the respective second signal lines 140. Thus, when the position of the pixel 12 for designating the light receiving area 16 is selected, the signals of the pixels 12 belonging to the light receiving area 16 are output uniquely through the second signal lines 140.

It should be noted that the arrangement order of the first signal lines 100 connected to the pixels 12 and the second signal lines 140 connected to the first signal lines 100 in FIG. 10 is only an example, and they are not necessarily arranged in this manner. The arrangement order may be any, provided that the outputs of the pixels 12 belonging to the light receiving area 16 are each output uniquely from the second signal line 140.

Another possible configuration may be that the dimensions of the light receiving area 16, that is, the first predetermined number and the second predetermined number, are variable according to granularity desired for the measurement. In this case, between the pixels 12 arranged along the second direction, the first signal lines 100 in the maximum number of the first predetermined number are provided, and the second signal lines 140 in number equal to (the maximum value of the first predetermined number)×(the maximum value of the second predetermined number) are provided so as to be connected to the first signal lines 100 through the second switches 150. The first selection lines 120 are provided in the same manner as in the case of the aforesaid connection of the first signal lines 100 and the pixels 12. This also applies to the second switches 150 and the second selection lines 160.

Figure 11:
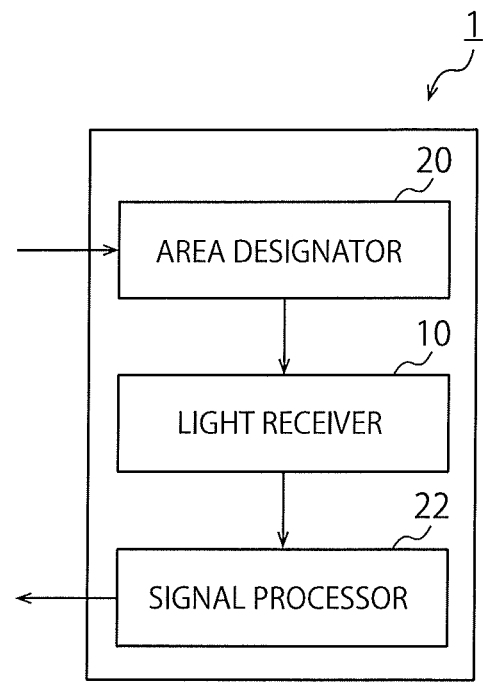
FIG. 11 is a block diagram illustrating functions of the light receiving device according to one embodiment.

FIG. 11 is a diagram illustrating the circuit configuration (or device configuration) of the light receiving device 1. The light receiving device 1 includes the aforesaid light receiver 10, an area designator 20, and a signal processor 22. These components including the aforesaid configuration may be partly or entirely constituted by a processing circuit. Further, the signal processor 22 may be a device independent of the light receiving device 1.

The area designator 20 designates the light receiving area 16. The designation of the light receiving area 16 by the area designator 20 is based on, for example, predetermined algorithm (for example, sinusoidal vibration) and parameters. In another example, the light receiving area 16 is designated based on position information or synchronization information which is externally output. The area designation is executed based on the first-direction position and the second-direction position. The area designator 20 applies a voltage, current, or the like for driving the switches to the first selection line 120 corresponding to the position to be designated in the first direction and to the second selection line 160 corresponding to the position to be designated in the second direction. According to the selection lines to which the voltage or the like is applied from the area designator 20, the above-described operation in the light receiver 10 is driven.

The signal processor 22 processes the output signals from the second signal lines 140 in the light receiver 10. For example, the output signals are A/D converted, and at the time when the signals have peaks, it is determined that light is received. In another example, the AD conversion results of the output signals are integrated (averaged), and at the peak time thereof, it is determined that light is received. In still another example, when the sum of the signals output from the second signal lines 140 exceeds a first threshold value, it is determined that light is received in the light receiving area 16. In yet another example, when the number of the second signal lines 140 that output signals exceeding a second threshold value is over a third threshold value, it may be determined that light is received in the light receiving area 16. In yet another example, the determination may be based on the comparison of the sum of the outputs from the second signal lines 140 corresponding to the first-direction positions M, M+1, . . . at the second-direction position N with a fourth threshold value 4.

The signal processor 22 outputs the time when the light is received in the light receiving area 16, the intensity of the light reception signal, and the intensity of ambient light. By applying smart accumulation technique (SAT) to the light receiving area 16, it is possible to integrate only the signals from the pixels 12 of interest (relevant pixels) out of signals of pixels around the relevant pixels. This enables to output the results regarding each of the pixels 12 with an improved SNR. Another adoptable example is to apply the interpolation to the intensities of the light detected in the pixels 12 in the light receiving area 16 and find a peak value and the intensity distribution of the entire light receiving area 16 to output these. Similarly to the above, the sum of the light intensities output from the predetermined first number of the pixels 12 along the first direction may be calculated at each second-direction position and the second predetermined number of the sums may be output.

In the application in LIDAR, for example, by synchronizing the light receiving area 16 with the motion of the light emitting device (for example, a laser) and measuring the light receiving time, it is possible to measure the distance to a reflecting object. As previously described, according to this embodiment, an area having a predetermined range is set as the light receiving area 16, the position of the light receiving area 16 is designated, and the corresponding pixels 12 are selected, whereby it is possible to receive light in an area having a certain range. Therefore, owing to the measurement in the area with a certain range, strict synchronization is not necessary, and the range finding by LIDAR is possible even if the synchronization is relatively loose. Similarly, because of the measurement in the area with a certain range, the device has robustness against the positional misalignment of the light receiving position. Further, even light received between the pixels 12 can be detected.

Further, in the light receiving device used in LIDAR, if a focus of a light receiving optical system is at an infinite distance, reflected light from an object in a short range is defocused to be radiated to a wide area, but even in such a case where there is a large difference in light intensity, the accurate detection of received light is possible. Further, when the light intensity is especially large, a sensor may saturate or a residual output may remain for a long time, but in the case of such measurement in a wide area as well, the measurement can be done in an area of other surrounding pixels where the light intensity is small. Further, when a non-coaxial optical system is employed as is often the case, the irradiation position of the reflected light differs depending on the distance. Especially when the reflecting object is close, a light receiving position in the light receiver is likely to be misaligned, but owing to the detection in a relatively wide area, the accurate measurement is possible also in such a case. Accordingly, the light receiving device 1 can have improved light-reception accuracy.

Providing the plurality of light receiving areas as illustrated in FIG. 3 enables the detection of reflections of a plurality of laser lights. Using a plurality of light emitting devices can increase laser power and makes it possible to increase the number of measurement times. As a result, the distance can be longer and resolution can be improved. Further, it is possible to use a multi-stack laser device, in particular, one having large inter-stack intervals.

Further, in this example, owing to the connection of the pixels 12 and the first signal lines 100 by the switches 110 and the connection of the first signal lines 100 and the second signal lines 140 by the switches 150 illustrated in FIG. 4 to FIG. 10, the relative positions in the light receiving area 16 and the output order do not change irrespective of the values of the first-direction position M and the second-direction position N. For example, as illustrated in FIG. 10, the signal of the pixel 12 at the left upper position in the light receiving area 16 is output from the uppermost second signal line 140. The output order is in ascending order of (M, N). This feature enables the signal processor 22 and circuits on subsequent stages to specify which pixel 12 has output the signal output from each of the second signal lines 140, only from the first-direction position M and the second-direction position N. Eliminating processing required for this specification makes it possible to simplify the signal processor 22 and the circuits on the subsequent stages.

Second Embodiment

Figure 12:
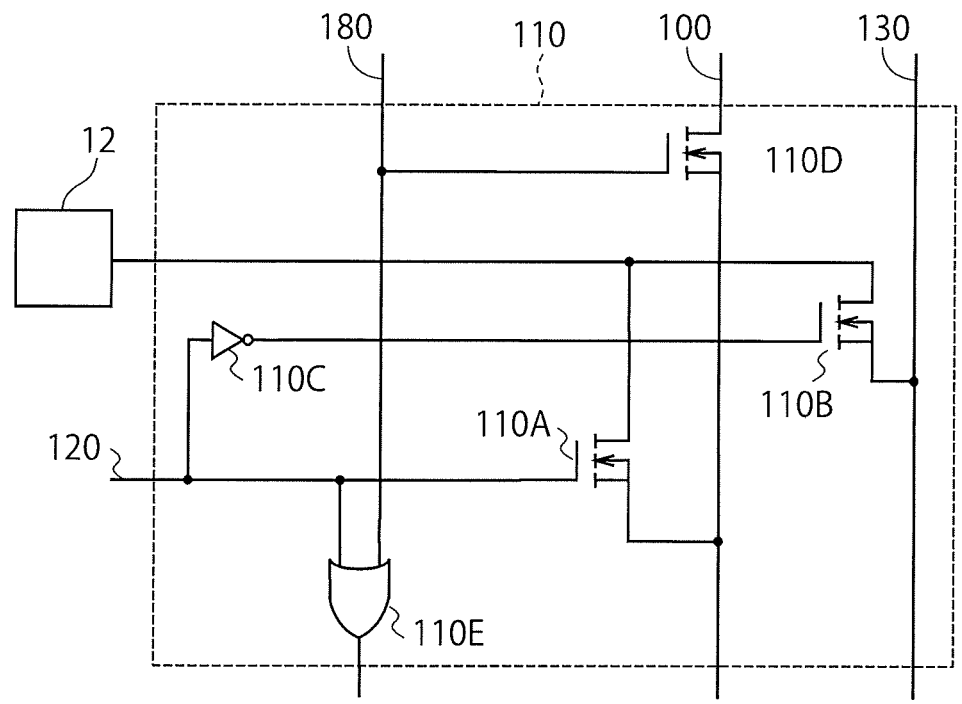
FIG. 12 illustrates a first switch according to one embodiment.

FIG. 12 is a diagram illustrating another example of the first switch 110 in the above-described embodiment. The first switch 110 includes, for example, transistors 110A, 110B, 110D, a NOT circuit 110C, and an OR circuit 110E. The transistors each include an n-MOSFET in which a drain-source current flows when a voltage equal to or higher than a threshold value is applied to its gate, for instance.

In the above-described simplest embodiment, the transistor 110A out of the aforesaid circuit elements is provided. In this case, the transistor 110A has the drain connected with the pixel 12, the gate connected with the first selection line 120, and the source connected with the first signal line 100.

In the case where the dummy line is provided in the above-described embodiment, the transistors 110A, 110B and the NOT circuit out of the aforesaid circuit elements are provided. In this case, the connection of the transistor 110A is the same as above. On the other hand, the transistor 110B has the drain connected with the pixel 12, the gate connected with the first selection line 120 through the NOT circuit 110C, and the source connected with the first dummy line 130. In this case, in the absence of the application of the selection signal in the first selection line 120, not the transistor 110A but the transistor 110B is driven, and the signal from the pixel 12 is output to the first dummy line 130. Conversely, in the presence of the application of the selection signal in the first selection line 120, not the transistor 110B but the transistor 110A is driven, and the signal from the pixel 12 is output to the first signal line 100.

In this embodiment, the dummy line 130 is provided, and in addition, the transistor 110D and the OR circuit 110E are provided. Further, a first flag line 180 connects with the first switch 110. In the first flag line 180, there flows a signal indicating whether or not the signal from the pixel 12 corresponding to this switch has been output through the first switch 110 provided more upstream than this switch. The signal which flows in the flag line 180 may be, for example, a High or Low signal as in the selection lines. In this case, the Low signal is applied to the first flag line 180 at the most upstream side.

Not all the first switches 110 need to have the configuration in FIG. 12, and only some of the first switches 110 may have this configuration, and the other first switches 110 may have the configuration of the above-described embodiments, with the OR circuit 110E is added thereto. The transistor 110D has the drain connected with the first signal line 100, the gate connected with the first flag line 180, and the source connected with the first signal line 100 and the transistor 110A.

In the absence of the application, in the first selection line 120, the voltage for causing the signal from the pixel 12 to be output to the first signal line 100, the transistor 110A is off and the transistor 110B is on, and the signal output from the pixel 12 is output to the first dummy line 130 without being output to the first signal line 100. This signal output from the pixel 12 to the first dummy line 130 is processed so as not to be an output from the light receiving area 16.

In this case, in the first flag line 180, the same signal as the signal coming from the upstream side flows to the downstream side through the OR circuit 110E. That is, when the High signal is applied to any of the first selection lines 120 on the upstream side, transistors corresponding to the transistors 110D located more upstream than the first switch 110 to which this signal is applied, that is, the first switch 110 corresponding to the selected pixel 12, turn off, transistors corresponding to the transistors 110D immediately downstream of the first switch 110 corresponding to the selected pixel 12 turn on. As a result, the first signal lines 100 and the second signal lines 140 corresponding to the selected pixel 12 and subsequent pixels are connected to each other through the second switches 150.

On the other hand, in the presence of the application, in the first selection line 120, the voltage for causing the signal from the pixel 12 to be output to the first signal line 100, the transistor 110A turns on and the transistor 110B turns off. The signal from the pixel 12 is output to the first signal line 100 without being output to the first dummy line 130. Then, the signal from the pixel 12 output to the first signal line 100 is output to the second signal line 140 through the second switch 150.

In this case, in the upstream side, the selection signal in the corresponding first selection line 120 is not applied, the signal from the pixel 12 is not output from the same first signal line 100, and no signal is output to or a Low signal is flowing in the first flag line 180. Accordingly, in the transistor 110D, a voltage lower than the threshold voltage is applied to the gate, so that the transistor 110D turns off. That is, the first signal line 100 becomes electrically insulated on a more upstream side than this pixel 12.

On the other hand, to the downstream side, the result of the logical sum of the first selection line 120 and the upstream first flag line 180 flows in the first flag line 180 through the OR circuit 110E, and accordingly, a High signal flows in the downstream first flag line 180. As a result, in the downstream side, the signal output from this pixel 12 is output.

As described above, according to this embodiment as well, an area having a predetermined range is set as the light receiving area 16, the position of the light receiving area 16 is designated, and the corresponding pixels 12 are selected, which makes it possible to receive light in an area having a certain range. Since the pixel 12 is connected to the dummy line through the switch when the switch is off, ambient light (noise) received in the pixels 12 belonging to a non-selected area is not transmitted to the output, enabling an improvement in SNR. Further, when a large quantity of light is radiated, it is possible to inhibit a carrier from an area other than the selected area from flowing to the output, making it possible to alleviate a saturation state, for example, shorten a period during which the output of the pixel is saturated. Further, since the use of the transistor 110D makes it possible to determine whether to transmit a signal from the upstream side to the first signal line 100, it is possible to reduce a parasitic capacitance of the signal line, and as a result, it is possible to inhibit a band of the output from the pixel 12 from degrading.

It should be noted that, though it is described that the flag line is present only in the first direction, this is not restrictive. For example, second flag lines may be provided along the respective second signal lines 140, and some or all of the second switches 150 may connect with the second flag lines as in FIG. 12.

Third Embodiment

In the above-described embodiments, the first signal lines 100 are provided in every space between the pixels 12 adjacent in the second direction, but this is not restrictive.

Figure 13:
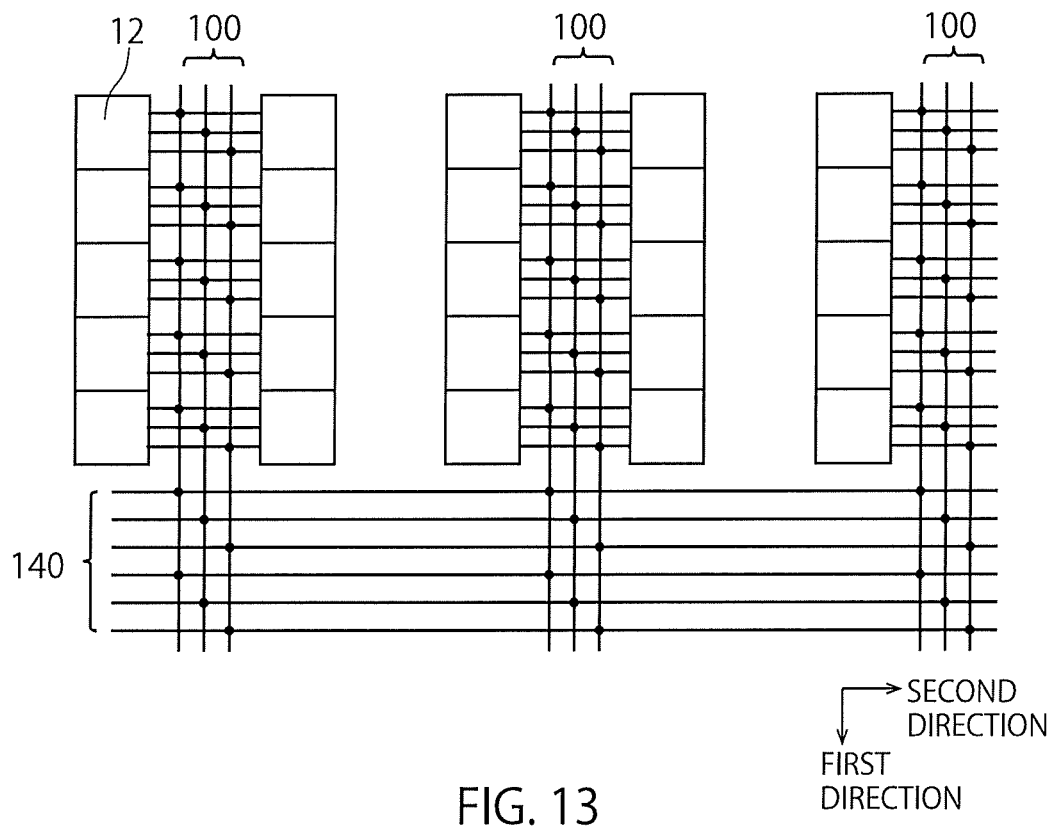
FIG. 13 illustrates the connection between the pixels and the first signal lines according to one embodiment.

FIG. 13 is a diagram illustrating another example of the connection of the pixels 12 and the first signal lines 100. As illustrated in FIG. 13, the first signal lines 100 may be shared by the pixels 12 adjacent in the second direction. This sharing enables to improve light sensitivity when light is received in the pixels 12 adjacent in the second direction.

This configuration makes it possible to reduce the number of the first signal lines 100 and the second signal lines 140. That is, not only the aforesaid improvement in light sensitivity but also a reduction in mounting area is enabled. Further, the reduction in the wiring lines themselves can reduce a trouble occurrence probability.

Fourth Embodiment

In the above-described embodiments, in order to correct the misalignment of the light receiving area 16, it is important that the relation of the pixel positions in the light receiving area 16 and the output order is kept unique irrespective of the position of the light receiving area 16, as in the light receiving device 1 according to the above-described first to third embodiments. Specifically, in the case of the 3×4 light receiving area, the output order is (M, N→M+1, N→M+2, N→ . . . ) as illustrated in FIG. 10. A fourth embodiment describes a light receiving device 1 that achieves a reduction in a wiring capacitance and a reduction in the area of a light receiver while keeping this order.

Figure 14:
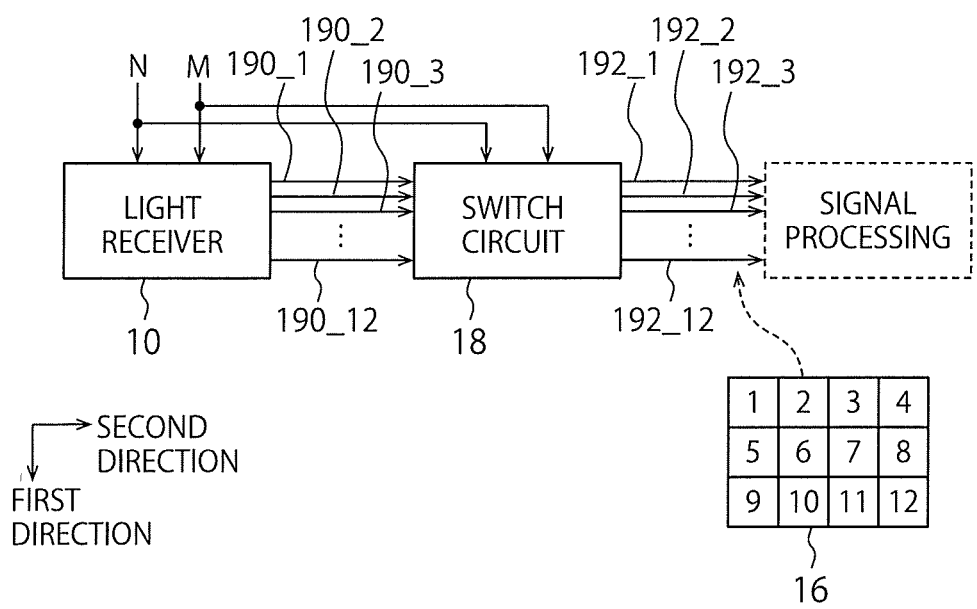
FIG. 14 illustrates another example of a light receiver of the light receiving device according to one embodiment.

FIG. 14 is a diagram illustrating outputs from the light receiver 10 according to this embodiment. The light receiver 10 connects with a signal processing circuit through a switch circuit 18 which adjusts the order of signals output from the light receiver 10 so that the signals from the light receiving area 16 are output in the correct order. The outputs from the pixels 12 in the light receiving area 16 are arranged in the order in the switch circuit 18 based on a condition, instead of being automatically arranged in the order in the switches and the signal lines when M, N are decided as described in the above-described embodiments.

Incidentally, the switch circuit 18 may be integrated with the signal processing circuit or may be on a subsequent stage of part or all of circuits of the signal processing circuit. The signal processing circuit may include an analog circuit such as an amplifier, an AD converter, and a logic circuit for integration such as SAT as previously described, and in this case, the switch circuit 18 may be between the AD converter and the logic circuit. This prevents an analog signal from being degraded by the switch circuit 18, enabling logic processing requiring the correct output order or pixel position information.

Instead of keeping the relation of the pixel positions in the light receiving area 16 and the output order unique, the switch circuit 18, which is added between the light receiver 10 and the signal processing circuit, changes the output order to a unique one set in the light receiving area 16. The switch circuit 18 also receives the signal of N and M indicating the position of the light receiving area 16, and based on M and N, decides the output order by switching. The switch circuit 18 may be one based only on logic or one based on a table. There are two ways to set the number of input lines of the switch circuit 18: one is to set its number equal to the number of output lines; and the other is to set its number larger than the number of the output lines. The switch circuit 18 is realized by a later-described logic circuit based on various algorithms or by a table-driven circuit. The latter uses a table showing M, N and the correspondence between the order of the output signals and the relative positions in the light receiving area 16.

The pixels 12 in the light receiver 10 connect with the switch circuit 18 through pixel-switch signal lines 190 corresponding to the pixels 12 respectively. When receiving the signals from the pixels 12 belonging to the light receiving area 16, the switch circuit 18 outputs the signals from the pixels 12 to the respective output lines 192 based on the order set in the light receiving area 16 shown in the right lower part of FIG. 14, for instance. For example, let the number indicating this order in each pixel be x, the signal from the pixel 12 corresponding to the position of x in the light receiving area 16 is output through the output line 192_x. By signal processing performed at a receiving side of the output line 192_x corresponding to this x, the calibration of the positional misalignment and so on described in the above-described embodiments or other processing based on the position in the light receiving area 16 is performed. Thus, it is possible to execute the signal processing without changing the order related to the relative position in the light receiving area 16.

Figure 15:
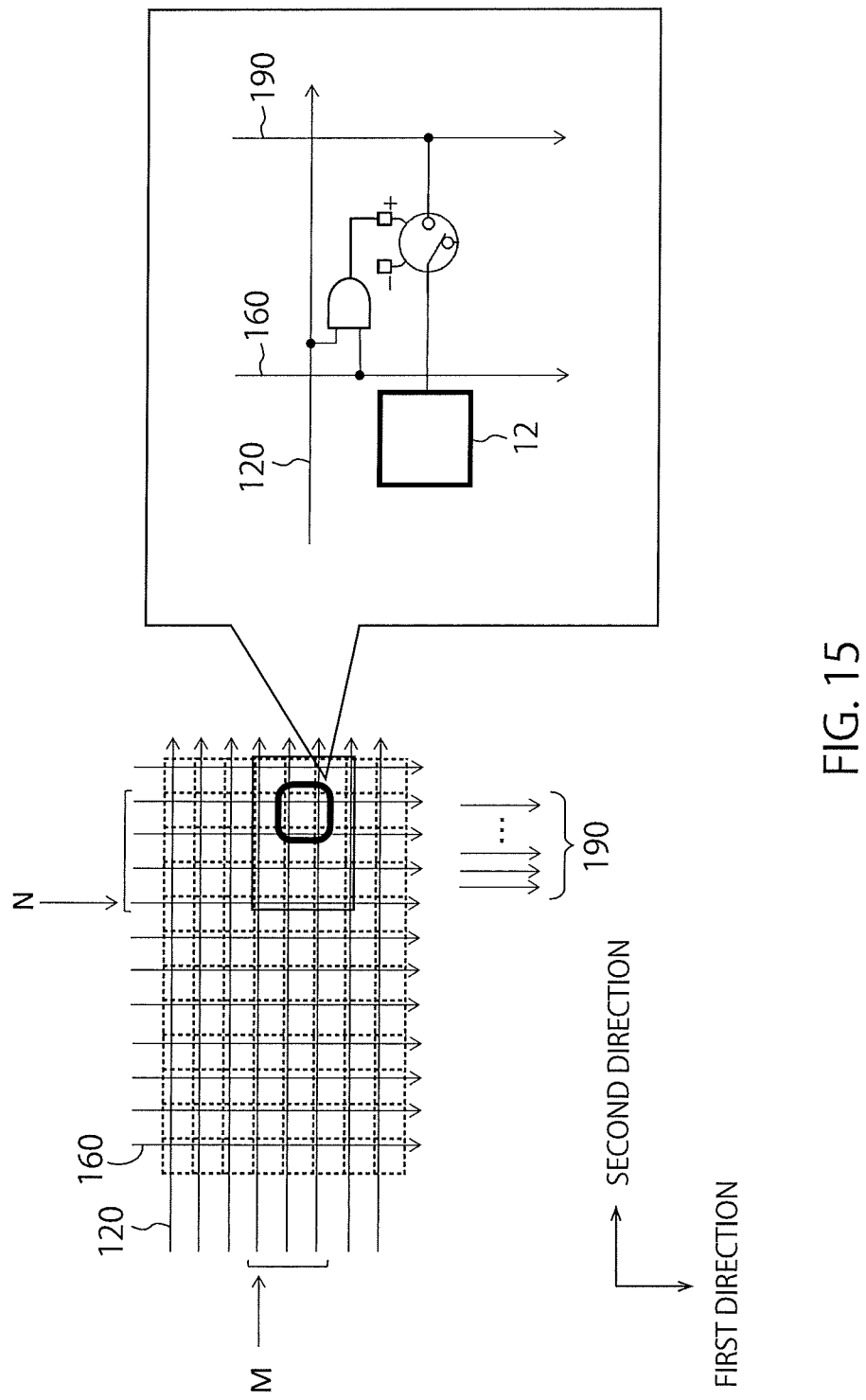
FIG. 15 illustrates another example of the light receiver of the light receiving device according to one embodiment.

FIG. 15 is a diagram illustrating the light receiver 10 in FIG. 14 in more detail. The light receiver 10 has the same number of the first selection lines 120 as the pixel count in the first direction and the same number of the second selection lines 160 as the pixel count in the second direction. Based on the first-direction position M and the second-direction position N, part of the first selection lines 120 and the second selection lines 160 turn on and the others turn off. The enlarged diagram in the right part of FIG. 15 illustrates the periphery of the pixel 12, and as illustrated in the enlarged diagram, when the first selection line 120 and the second selection line 160 which correspond to the pixel 12 are both on, a corresponding switch is turned on through an AND circuit, and a signal of this pixel 12 is connected to the predetermined pixel-switch signal line 190 through this switch. As the switch, the same one as that in FIG. 12 is usable, and signals of pixels not connected are connected to the dummy lines (130 in FIG. 12). Thus, based on the signals applied in the first selection line 120 and the second selection line 160, the control is performed so that the signals from the pixels 12 belonging to the light receiving area 16 are output.

In this embodiment, irrespective of the values of N and M, the signal from each of the pixels 12 is output to the predetermined output line of the light receiver 10. Therefore, for the signal processing, the switch circuit 18 needs to be added to re-arrange the signals in the order to keep the output order unique. However, since the pixel-switch signal lines present in the light receiver 10 serve as the first selection lines 120, the second selection lines 160, and the pixel-switch signal lines 190, the number of these lines is greatly reduced and their wiring capacitance is also reduced. Further, the total number of the switch circuits in the light receiver 10 is also smaller than in the first embodiment. In a light receiver, a sensor area ratio has an influence on sensitivity, and owing to the reduction in the number of the signal lines and the number of the switch circuits, the sensor area ratio increases, resulting in improved sensitivity.

The correspondence of the pixels 12 and the pixel-switch signal lines 190 may be decided based on, for example, the remainder of the first predetermined number by m and the remainder of the second predetermined number by n, where m is the first-direction position and n is the second-direction position of the pixel 12 in the light receiver 10. What is necessary is that, when the light receiving area 16 is designated, the pixels 12 in this area and the pixel-switch signal lines 190 are connected such that these pixels 12 are not connected to the same pixel-switch signal line 190.

When, for example, the first predetermined number is 3 and the second predetermined number is 4, let a pixel at m that gives a as the result of the first predetermined number by m and at n that gives b as the result of the second predetermined number by n be expressed as (a, b), (0, 0) is connected to the first pixel-switch signal 190_1, (0, 1) is connected to the second pixel-switch signal 190_2, . . . (1, 0) is connected to the fifth pixel-switch signal 190_5, . . . and (2, 3) is connected to the twelfth pixel-switch signal 190_12.

On the other hand, the switch circuit 18, when deciding the order based on, for example, logic, arranges the outputs from the pixels 12 in the order based on the remainder of the first predetermined number by M and the remainder of the second predetermined number by N where M and N indicate the position of the light receiving area 16 in the light receiver 10. For example, if the remainder of 3 by M is equal to A, and the remainder of 4 by N is equal to B, the X-th pixel-switch signal line 190_X where X=(1+(A×the second predetermined number)+B) is connected to the output line 192_1, and the X+1-th pixel-switch signal line 190_(X+1) is connected to the output line 192_2. Then, the pixel-switch signal lines and the output lines are similarly connected based on the value of X. Incidentally, if the number (X, X+1, and so on) indicating the pixel-switch signal line 190 and the output line 192 is larger than twelve, the pixel 12 is appropriately connected to one having the number cyclically counted from 1.

Incidentally, the number of the pixel-switch signal lines 190 may be larger than the pixel count in the light receiving area 16. In this case, the correspondence relation of the pixel-switch signal lines 190 and the remainders is changed based on the number of the pixel-switch signal lines 190. Alternatively, as described above, on/off of the switches may be changed based on the table showing the connection relation after M, N are input, for instance, instead of using the remainders. The use of the remainders is only an example, and the switch circuit 18 may be any circuit, provided that it adjusts the order. Further, the order is not limited to that in FIG. 14 and for example, may be one whose correspondence with the light receiving positions can be specified for the purpose of the position adjustment or the like in the following embodiment.

As described above, this embodiment similarly to the above-described embodiments makes it possible to receive light in an area having a certain range by setting the light receiving area 16. Further, since it is possible to grasp at which relative position in the light receiving area 16, the pixel 12 outputting the signal is located, it is possible to keep the pixel output order set in the light receiving area 16 while reducing the number of intermediate signal lines to further reduce the wiring capacitance and the area of the light receiver 10.

Fifth Embodiment

The light receiving device 1 according to the above-described embodiments may be used in LIDAR. In the application in ordinary LIDAR, the above-described light receiving device 1 is provided in a range finding device including a light emitter and a rangefinder, and the range finding is conducted based on an output from the light receiving device 1 which has received light emitted by the light emitter. This embodiment relates to the light receiving device 1 or the range finding device which, if the light receiving position, that is, the light receiving area 16 is misaligned, corrects the position of the light receiving area 16 based on outputs of the light receiving area 16, in particular, based on the output distribution of the plurality of outputs.

Figure 16:
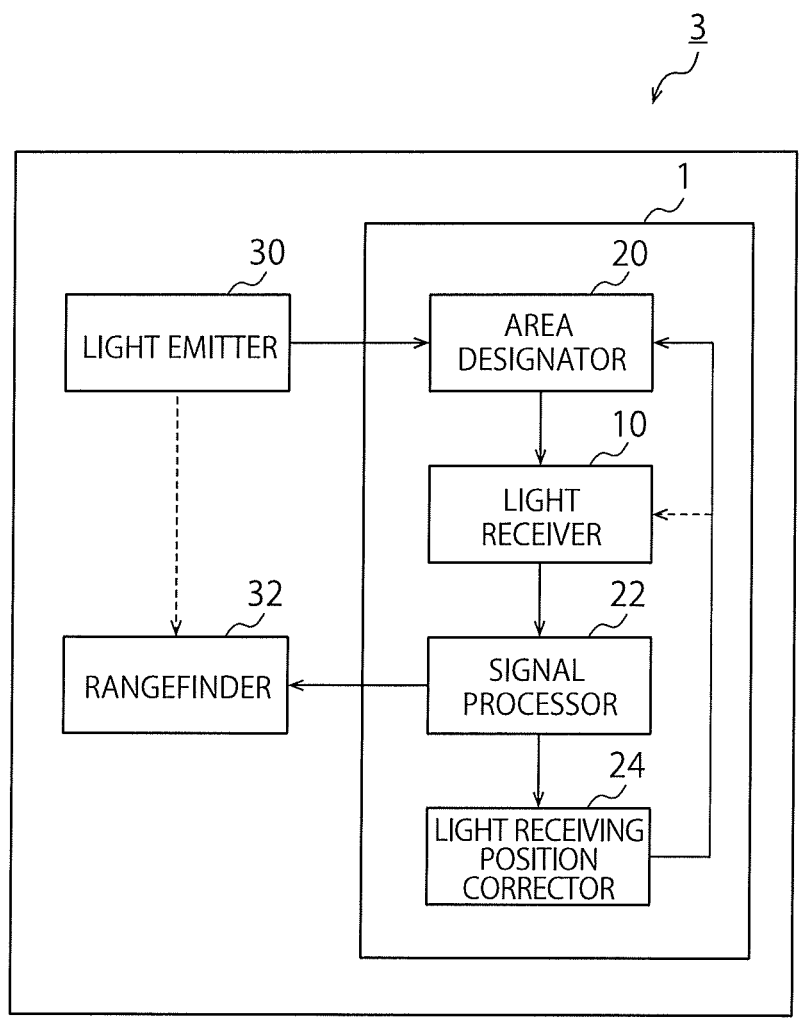
FIG. 16 illustrates functions of a range finding device according to one embodiment.

FIG. 16 illustrates an example of a block diagram where the light receiving device 1 is mounted in the range finding device (LIDAR) in this embodiment. The range finding device 3 at least includes a light emitter 30 and a rangefinder 32, in addition to the light receiving device 1 further including a light receiving position corrector 24.

The light emitter 30 at least includes a light emitting device such as, for example, a laser diode (LD). It further includes a device for causing the light emitting device to scan. It may further include devices (or circuits) such as a sensor which measures the facing direction of the light emitting device and an output device which outputs information about the facing direction. In this embodiment, in addition to the device which emits light to a target, the light emitter 30 may include a device which outputs, to the area designator 20, the time when the measurement using the light emitting device starts and the direction of the light emitting device at the time when the measurement starts.

The area designator 20 notifies the light receiving area 16 to the light receiver 10 using the position of the pixel 12 corresponding to the light receiving area 16 as described in the above embodiments, based on, for example, predetermined algorithm (for example, sinusoidal vibration) and parameters. The light receiving area 16 is a predetermined area out of the pixels 12 belonging to the light receiver 10 as illustrated in FIG. 1 and FIG. 2. Based on the notified position, the light receiver 10 outputs, to the signal processor 22, the outputs from the pixels 12 present in the light receiving area 16. The signal processor 22 processes the signals from the pixels 12 and outputs the results to the rangefinder 32 and the light receiving position corrector 24. In this embodiment, for example, the signal processor 22 outputs, to the rangefinder 32, the results regarding the light received in the pixels 12 continuous along the first direction in the light receiving area 16 and also outputs, to the light receiving position corrector 24, the sum of the intensities of their signals.

Based on the information output from the signal processor 22, the light receiving position corrector 24 decides information for use in the correction of the position of the light receiving area 16. In this example, based on the intensity distribution of the light received in the light receiving area 16, the position of the light receiving area 16 is corrected. The correction information is output to the area designator 20 or the light receiver 10 and is used for correcting the position of the light receiving area 16 in the light receiver 10. Examples of how the correction information is used may be as follows. Based on the correction information, the area designator 20 corrects the information which is based on the predetermined algorithm and the parameters, and designates a position to be selected as the light receiving area 16, through the first selection line 120 and the second selection line 160. Another example is that the light receiver 10 shifts the positions of the signals to be selected based on the information notified from the area designator 20. This correction will be described in detail later.

Based on the converted signals received from the signal processor 22, the rangefinder 32 measures the distance to the target. The distance to the target is found based on an interval between the time when the light is emitted from the light emitter 30 and the time when the light is received in the light receiver 10. This time interval may be found by the rangefinder 32 based on the result which it measures by receiving the light emitting time of the light emitter 30 and receiving, through the signal processor 22, the light receiving time of the light receiver 10. Alternatively, the light emitting device 1 may measure the time interval based on the light emitting time notified thereto from the light emitter 30 and the light receiving time of the light receiver 10 to notify the measured time interval to the rangefinder 32.

The rangefinder 32 measures the distance to the target based on the light emitting time, the light receiving time, and the velocity of the light and outputs the distance to an external part.

By setting the light receiving area 16 of the light receiver 10 as described above, it is possible to receive the light emitted from the light emitter 30 even when the light spreads, but the timing disagreement of the light reception may occur due to a temperature change, aged deterioration, and so on of the light receiver 10 and so on. In this embodiment, a description will be given of the light receiving device 1 which measures this timing disagreement to automatically correct the position of the light receiving area 16.

In FIG. 16, the light receiving position corrector 24 is illustrated inside the light receiving device 1, but this is not restrictive and it may be provided outside the light receiving device 1. That is, the calibration of the light receiving area 16 may be performed automatically in the light receiving device 1, or the reception of the information and the calibration may be performed outside the light receiving device 1. In the case where the correction information is obtained outside the light receiving device 1, the correction may be performed in the light receiving device 1 to which the correction information is notified, or based on a correction instruction notified from the outside of the light receiving device 1, the information in the light receiving device 1 may be corrected, or the notification of information from the light emitter 30 to the area designator 20 may be regarded as indicating the correction has been made, thereby substantially correcting the position of the light receiving area 16.

Further, the light receiving position corrector 24 may be provided in the rangefinder 32, and the rangefinder 32 may perform the correction of the light receiving position as well as the range finding. However, since information transmission between the light receiving device 1 and the range finding device 3 provided outside the light receiving device 1 may take time, the light receiving position corrector 24 is more desirably provided in the light receiving device 1 as illustrated in FIG. 16.

Figure 17:
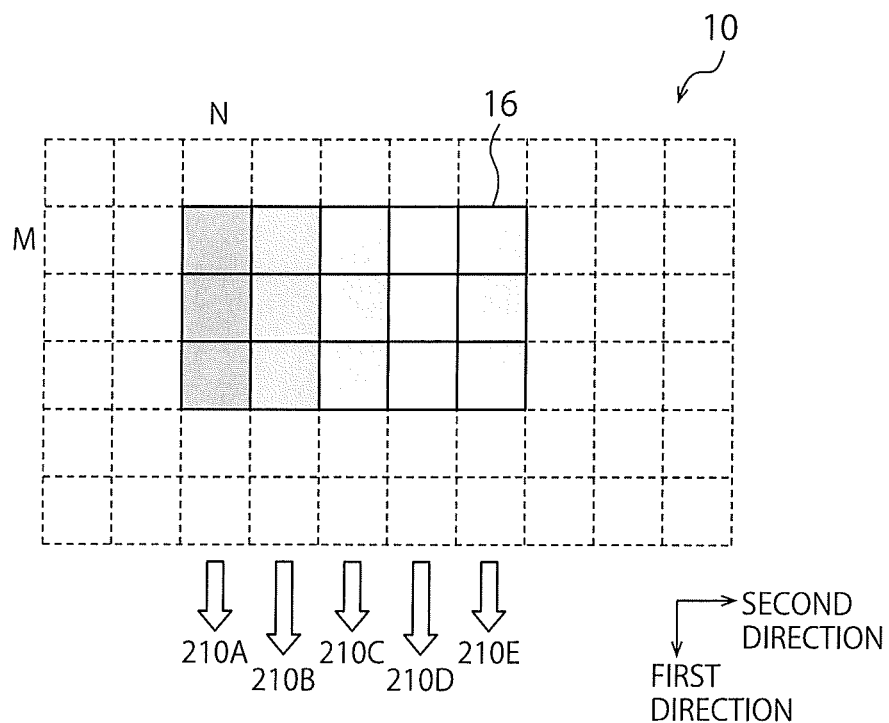
FIG. 17 illustrates an example of the intensities of received light according to one embodiment.

FIG. 17 is a chart illustrating an example of the intensities of light received in the light receiving area 16. The depth of color representing each pixel in the light receiving area 16 indicates the intensity of the received light, and the lighter color indicates a higher light intensity, and the darker color indicates a lower light intensity. The light receiving area 16 is illustrated as a 3×5 area whose first predetermined number is 3 and whose second predetermined number is 5. In the light receiving area 16, it is assumed that the intensity of the received light differs depending on the second-direction position as illustrated in FIG. 17.

Figure 18:
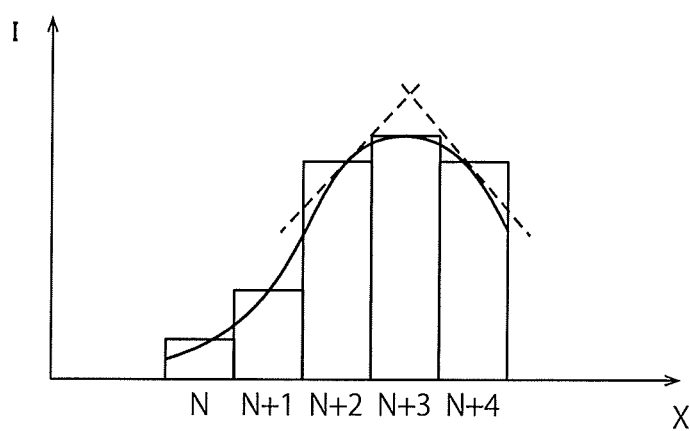
FIG. 18 illustrates an example of the intensity distribution of the received light according to one embodiment.

FIG. 18 is a chart illustrating a relation between the second-direction position in FIG. 17 and the light intensity. This is based on a light receiving optical system which is designed such that reflected light from a far place is focused on a width corresponding to two pixels, for instance. As a result of this design, the reflected light from a far place is focused on two to three pixels, and it is observed that the light spreads to the periphery of these pixels, though the light intensity there is weak.

For convenience of the description, the state where the light spreads only in the second direction is illustrated, but the spreading direction is not necessarily the second direction. It should be noted that the light may spread also in the first direction. In the following, a description will be given of the measurement and the correction when the light spreads only in the second direction, but they may be performed in a similar manner for the first direction. That is, in a correction direction which is either the first direction or the second direction, the misalignment is estimated from the light intensities and is corrected. The misalignment may be corrected not in either the first direction or the second direction, but in both of the directions. In this case, in executing the correction of the misalignment, whether the correction direction is the first direction or the second direction is taken into consideration based on the direction of the correction.

In the case where the light emitting device in the light emitter 30 is caused to scan while making a simple harmonic oscillation in the second direction, the position that the light emitted by the light emitter 30 reaches in the light receiver 10 is found by the following equation.

$$x = a \sin(\omega t + \phi) \quad (1)$$

Meanwhile, when receiving the information about the intensities of the light actually received in the light receiving area 16, the signal processor 22 calculates the sums of the outputs from the pixels 12 continuous in the respective rows along the first direction in the light receiving area 16 as 210A, 210B, ..., 210E as illustrated in FIG. 17. In FIG. 17, in the intensity distribution of the received light, 210A<210B<210C<210D>210E. The light receiving area 16 is misaligned leftward, and it is expected that shifting this area rightward results in more accurate light reception in the light receiving area 16. As described above, the magnitude relation may be found among all the intensities 210A, 210B, ... which are the sums found in the respective rows along the first direction in the light receiving area 16, or 210A and 210E (the sums in both ends of the light receiving area 16) may be simply compared and if 210A>210E, the light receiving area 16 may be regarded as being misaligned leftward, and if 210A<210E, it may be regarded as being misaligned rightward.

Varying the values of a, ω, or φ in eq. (1) enables the correction of the position of the light receiving area 16. For example, let us consider a case where the light receiving area 16 moves toward a position indicated by larger N from a position indicated by smaller N. In this case, shifting the phase by simply increasing φ enables to shift the light receiving area 16 rightward. When the second-direction position N is on the right side of the center of the light receiver 10, it is possible to shift the light receiving area 16 leftward by, for example, increasing the amplitude a or by increasing the frequency ω. Conversely, when the second-direction position N is on the left side of the center, it is possible to shift the light receiving area 16 rightward by, for example, reducing the amplitude a or by reducing the frequency ω. The position of the light receiving area 16 can be thus corrected so that a more desirable result is obtained at the next light receiving timing.

When the light receiving area 16 moves toward a position indicated by smaller N from a position indicated by larger N, the position is corrected in an inverse manner to the above, for instance. More simply, in either case, the area designator 20 may shift the light receiving area 16 rightward by, for example, increasing the current value of the second-direction position of the area to be selected by $+\alpha(\alpha \geq 1)$.

The value of α may be calculated based on the intensity distribution of the light received in the light receiving area 16, or may be set to a predetermined value, for example, $\alpha=1$. The simplest way is to shift the light receiving position in the second direction by +1 when the light receiving area 16 is misaligned leftward, and to shift the light receiving position in the second direction by −1 when the light receiving area 16 is misaligned rightward.

In the case where the value of a is varied, a is found as follows, for instance. In the case of the intensity distribution in FIG. 18, the upwardly convex curve depicted by the solid line is found and α is estimated from the center of the distribution. Another way may be to find the broken-line straight lines fit on the solid-line curve using a FIR correlation filter or the like, find the center of the distribution, and estimate α. The position of the light receiving area 16 is thus corrected by α estimated based on the intensity distribution.

Further, in the case where the correction is performed based on the obtained intensities of light radiated to and reflected by a target, some reflecting object may cause nonuniform reflection intensity. An example of the way to cope with such nonuniformity is to obtain light reception data a plurality of times, obtain the intensity distribution in the light receiving area 16 using a statistic such as an average of the light intensities at the positions in the light receiving area 16, and estimate the positional misalignment amount α based on the obtained intensity distribution. This enables stable pixel scanning without an unintentional bias such as nonuniform reflection by the target object.

In the above, the magnitude relation among the sums 210A, . . . in the respective rows along the first direction in the light receiving area 16 is used for the correction, but this is not restrictive, and another example may be to find the total values 210AC=210A+210B+210C, 210BD=210B+210C+210D, and 210CE=210C+210D+210E by conducting the measurement the plurality of number of times (for example, corresponding to one frame), compare the total values 210AC, 210BD, and 210CE to find their magnitude relation, and based on the magnitude relation, correct the position. For example, when the total value 210AC is the largest, the position is shifted leftward by one, when the total value 210BD is the largest, the position is not shifted, and when the total value 210CE is the largest, the position is shifted rightward by one for the correction. The position is thus corrected based on the intensity distribution using an index with which the high-speed arithmetic operation is enabled.

As still another example, stray light may be used for the correction. In the range finding device 3, emitted light is sometimes reflected or scattered by its casing, and the reflected light or scattered light is the stray light. Some area in the light receiver 10 receives the stray light in some case. For example, if the amplitude of the light emitting device in the light emitter 30 is large, the reflection occurs inside the casing of the range finding device 3, and in some case, the light thus reflected is received by the light receiver 10.

In the state where the stray light thus occurs, light receiving position data or the like of the light receiver 10 may be stored in a not-illustrated memory, and the correction may be performed using a deviation from the stored position data. The stored data is data which is obtained, for example, at the shipment time from a factory or at the time when the device is first activated after mounted in an automobile or the like. The deviation may be corrected by storing a reference light receiving state of the stray light, and at the time of or before the execution of the range finding, receiving stray light in the same state, and comparing a position where the stray light is received with the position data stored in the memory.

In this case, scanning synchronization, a scanning range, and so on are adjusted based on the time to the detection and the intensity distribution. They are values uniquely determined by an emission position if the stray light is used, and therefore, the use of the stray light enables the stabler adjustment than the method using the reflected light from an object. Further, the adjustment can be made with a smaller number of measurement times, enabling quicker adjustment and thus enables the early detection of abnormality even if it occurs.

Conventionally, light is received in a one-pixel range, and in order to match a light receiving position and the designation of a pixel position based on a sensor provided in a light emitting device, highly accurate sensing and control are necessary. On the other hand, as described above, according to this embodiment, based on the light reception signals from the pixels 12 in the light receiving area 16 having a certain range, it is also possible to correct the light receiving position easily and surely. Further, such correction makes it possible to cope with aged deterioration of the device and an unexpectedly occurring abnormality.

Sixth Embodiment

Figure 19:
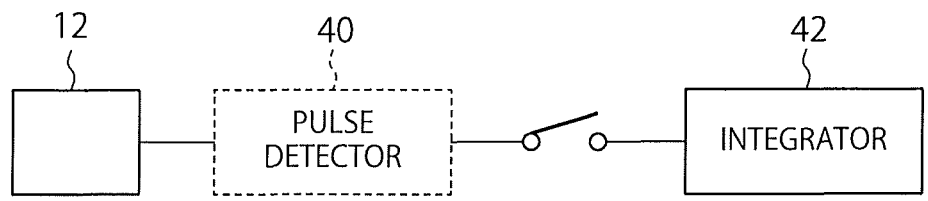
FIG. 19 illustrates another example of the light receiver of the light receiving device according to one embodiment.

FIG. 19 illustrates a light receiving device including an integrator which counts the number of signals output from the light receiving device 1 during a predetermined time. In this embodiment, between the pixels 12 and an output of the light receiving device 1, pulse detectors 40, various kinds of switches (the first switches 110 and the second switches 150, or the switch circuit 18), and integrators 42 are provided. A detailed description of the configuration of each of the switches, which is the same as that in the above-described embodiments, will be omitted. The second signal lines 140 are connected as inputs of the integrators 42. In the case where a signal processing device is provided, an output of the integrator 42 is connected as an input of the signal processing device.

The pulse detector 40 detects a pulsed signal from the signal which the pixel 12 outputs as a result of detecting light. For example, the single pulse detector 40 is provided for each pixel 12. As another example, the single pulse detector 40 may be provided for each second signal line 140 in FIG. 4 and so on or for each output line 192 in FIG. 14. Depending on the performance of the pixel 12, this pulse detector 40 is not an essential component. For example, if the pulsed signal from the pixel 12 can be appropriately detected in the integrator 42 not through the pulse detector 40, the pulse detector 40 may be omitted. The pulse detector 40 may be a pulse detecting circuit constituted by an analog or digital circuit.

The integrator 42 integrates the results output by the pulse detector 40, or if the pulse detector 40 is not provided, integrates the results output by the pixel 12. For example, the integrator 42 is connected to the pulse detector 40 or the pixel 12 through a switch so as to receive the output from the pixel 12 in the light receiving area 16. The switch turns on when the pixel 12 is in the light receiving area 16, and otherwise turns off, similarly to the previously described various kinds of switches. That is, when the corresponding pixel 12 belongs to the light receiving area 16, the integrator 42 is connected to the pulse detector 40 or the pixel 12. Further, an output value of this integrator 42 is reset periodically, for example, every 10 ns.

The integrator 42 may be an integration circuit implemented by an analog or digital circuit. As another example, the integrator 42 may be a counter circuit which counts the number of pulses and is reset every predetermined time. Incidentally, the integrator 42 may be provided outside the light receiving device 1 instead of being provided therein and may integrate the pulses output from the light receiving device 1. In the case where the number of SPADs per pixel is one, the output signal corresponds to a binary digital signal, but the output signal is converted into a multi-value signal (converted into a multi-value analog signal) by the integrator 42 and is restored in a subsequent-stage AD converter. A semiconductor process for manufacturing the light receiving device 1 and that for manufacturing the signal processor 22 are desirably different, and they are often mounted as different IC chips. In this case, the conversion into the multi-value signal makes it possible to reduce the number of wiring lines between the chips and reduce the number of pins of the chips to downsize an IC package.

The response of SPAD is quick, for example, has a band of several GHz in the case where received light is pulsed. This also applies to a pixel including SPAD, and the response of a pixel including one SPAD or a pixel including a plurality of SPADs also has a band of, for example, several GHz in the case where received light is pulsed. Accordingly, if a wiring line between a light receiving device and a signal processing device is long, a signal may deteriorate and is not sometimes transmitted.

Figure 20:
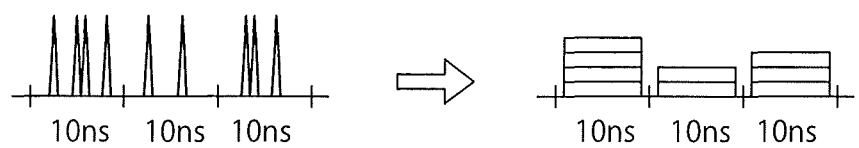
FIG. 20 illustrates an example of outputs of the pixel of the light receiving device according to one embodiment.

Therefore, based on the counted number of the pulses occurring during, for instance, a 10 ns period, the intensity of the received light is measured. FIG. 20 is a chart illustrating a measurement example when the SPAD receives the pulses. By outputting the number of the pulses of the received light as an analog value which is maintained for about 10 ns, the surer propagation is possible.

The integrator 42 need not be mounted in one-to-one correspondence to all the SPADs or all the pixels 12 provided in the light receiver 10, and may be mounted in the same number as the number of outputs, that is, in the same number as the number of the SPADs or the pixels 12 provided in the light receiving area 16. This makes the number of the outputs far smaller than the number of the pixels 12 or the like provided in the light receiver 10, to enable a reduction in silicon area for the mounting as compared with the case where they are mounted in correspondence to all the pixels 12 or the like. Further, the integrators 42 do not necessarily have to be mounted in the light receiver 10. Mounting the integrators 42 not in the light receiver 10 but in the light receiving device 1 or in the range finding device 3 provided outside the light receiving device 1 makes it possible to prevent a reduction in a sensor area ratio of the light receiver 10, that is, prevent light sensitivity from lowering.

Figure 21:
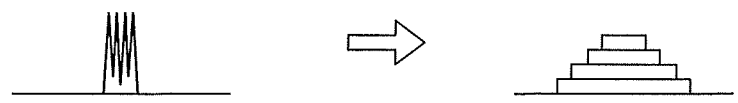
FIG. 21 illustrates another example of outputs of the pixel of the light receiving device according to one embodiment.

FIG. 21 is a chart illustrating another example of the measurement when the pulsed light is received. As illustrated in FIG. 21, a lowpass filter can also be used as the integrator. The use of the lowpass filter enables the measurement approximately similar to the integration. Further, some or all of the lowpass filters may be provided outside the light receiving device 1. The lowpass filter is constituted by a capacitor and a resistor, but it may be implemented by an analog or digital circuit, an IIR circuit, or an FIR circuit as is ordinarily the case. Incidentally, the lowpass filter does not require the aforesaid reset function. As illustrated in FIG. 19, by inserting the circuit for the pulse detection between the SPAD or the pixel 12 and the output, it is possible to output a signal of the SPAD or the like after converting the signal into a digital signal.

Combining the integrator 42 of this embodiment and a small and high-speed SPAD achieves a high-resolution light receiving device. An example of this may be to mount SPAD whose speed is four times as high as and whose size is equal to those of a conventional SPAD and provide a 4-bit integrator 42 to convert the signal into a multi-value (quaternary) signal. In this case, detection power equivalent to that of four conventional SPADs is expected, and the light receiving device 1 with an about ¼ area is achieved. Further, from a different point of view, the light receiving device 1 whose pixel count is about four times as many is achieved with an equal area. Further, in the case where the small SPAD and the integrator 42 are combined, owing to the high reaction speed of the small SPAD, a synergistic effect of the small area and the conversion into the multi-value signal by the integrator 42 makes it possible to achieve the light receiving device 1 with a larger pixel count (with a higher resolution).

Some or all of the circuits described above may be controlled by a control circuit such as a central processing unit (CPU). In this case, a memory connecting with the control circuit may be further provided. A program storing software processing which is necessary for some or all of these circuits to be concretely carried out by hardware may be stored in the memory. This program may be stored in a non-transitory computer-readable medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A light receiving device comprising
a light receiver comprising pixels arranged in an array in a first direction and in a second direction intersecting with the first direction, each of the pixels having one light receiving element or more; and
a light receiving area, variously arranged in the light receiver, having continuous pixels out of the pixels, outputting signals based on intensities of light received in the continuous pixels, wherein
the light receiving area is re-arranged in the light receiver according to a signal indicating a position in the first direction in the light receiver and a position in the second direction in the light receiver, and
the light receiving device further comprises a switch circuit configured to re-arrange the order of the signals from each of the pixels belonging in the light receiving area of the light receiver based on relative position of each of the pixels in the light receiving area.

2. The light receiving device according to claim 1, wherein the pixels each comprises one avalanche photodiode or more.

3. The light receiving device according to claim 1, wherein the light receiving area has a first predetermined number of the pixels along the first direction and a second predetermined number of the pixels along the second direction, and the light receiving device further comprising
the first predetermined number of first signal lines which, in the light receiver, are arranged in the second direction and extend in the first direction between the adjacent pixels, and which transmit signals from the pixels.

4. The light receiving device according to claim 3, further comprising:
first switches which selectively connect the pixels and the first predetermined number of the first signal lines corresponding to the pixels; and
first selection lines which each connect with drive terminals of the first switches and transmit a signal for turning on the first switches so as to connect the first predetermined number of the pixels along the first direction to different ones of the first signal lines respectively,
wherein the first selection lines each connect with the drive terminals of the first switches corresponding to the pixels arranged along the second direction at the position designated in the first direction.

5. The light receiving device according to claim 3, further comprising second signal lines each connecting with one of the first
signal lines, the number of the second signal lines being equal to the number of the pixels present in the light receiving area.

6. The light receiving device according to claim 5, further comprising:
second switches which selectively connect the first signal lines and the second signal lines; and
second selection lines which each connect with drive terminals of the second switches and transmit a signal for turning on the second switches to connect the first signal lines which connect with the second predetermined number of the pixels along the second direction belonging to the light receiving area to different ones of the second signal lines.

7. The light receiving device according to claim 1, further comprising an area designating circuit which designates the position of the light receiving area in the light receiver.

8. The light receiving device according to claim 1, comprising a light receiving position correcting circuit which corrects the position of the light receiving area in a correction direction based on the detected light intensity, the correction direction being at least one of the first direction and the second direction.

9. The light receiving device according to claim 1, comprising a light receiving position correcting circuit which, when the light receiver receives stray light, corrects the position of the light receiving area based on a position where the stray light is received in the light receiver.

10. The light receiving device according to claim 1, wherein
the switch circuit connects with signal lines which output signals from the pixels in the light receiver, wherein when outputting the signals from the pixels belonging to the light receiving area in the light receiver, the switch circuit arranges the signals in order based on positions of the pixels in the light receiving area.

11. The light receiving device according to claim 10, comprising:
first selection lines which select the pixels in the first direction selected as the light receiving area in the light receiver; and
second selection lines which select the pixels in the second direction selected as the light receiving area in the light receiver; and
circuits which each control an output of the corresponding pixel based on a logical product of outputs of the first selection line and the second selection line.

12. The light receiving device according to claim 1, comprising an integration circuit which, when outputting signals indicating that light is received by the pixel to an external part, calculates an integration value of the signals during a predetermined time, the integration value being output from the light receiving device.

13. The light receiving device according to claim 12, comprising a plurality of integration circuits wherein the number of the integration circuits is equal to the number of the pixels included in the light receiving area.

14. The light receiving device according to claim 1, wherein the light receiving area is provided in plurality in the light receiver.

15. A range finding device comprising:
a light emitting device which emits light to a target;
the light receiving device according to claim 1; and
a range finding circuit which measures a distance to the target based on a time when the light emitting device emits the light and a time when the light receiving device receives the light emitted by the light emitting device.

16. The range finding device according to claim 15, wherein the position of the light receiving area synchronizes with a motion of the light emitting device.

17. A range finding device comprising:
a light emitting device which emits light to a target;
the light receiving device according to claim 1;
an integration circuit which calculates an integration value of signals output from the light receiving device during a predetermined time; and
a range finding circuit which measures a distance to the target using an output of the integration circuit, based on a time when the light emitting device emits the light and a time when the light receiving device receives the light.

18. A range finding device comprising:
a light emitting device which emits light to a target; and
a light receiver comprising pixels arranged in an array in a first direction and in a second direction intersecting with the first direction, each of the pixels having one light receiving element or more which receives the light emitted by the light emitting device; and
a light receiving area, variously arranged in the light receiver, having continuous pixels out of the pixels, outputting signals based on intensities of the light received in the continuous pixels, the light receiving area being re-arranged in the light receiver according to a signal indicating a position in the first direction in the light receiver and a position in the second direction in the light receiver; and
a range finding circuit which measures a distance to the target based on a time when the light emitting device emits the light and a time when the light receiver receives the light emitted by the light emitting device, wherein
the range finding device further comprises a switch circuit configured to re-arrange the order of signals from each of the pixels belonging in the light receiving area of the light receiver based on relative position of each of the pixels in the light receiving area.

* * * * *